United States Patent
Do et al.

(10) Patent No.: US 11,042,686 B2
(45) Date of Patent: Jun. 22, 2021

(54) INTEGRATED CIRCUIT INCLUDING STANDARD CELLS OVERLAPPING EACH OTHER AND METHOD OF GENERATING LAYOUT OF THE INTEGRATED CIRCUIT

(71) Applicant: Samsung Electronics Co., Ltd., Suwon-si (KR)

(72) Inventors: Jung-ho Do, Hwaseong-si (KR); Jong-hoon Jung, Seongnam-si (KR); Ji-Su Yu, Seoul (KR); Seung-young Lee, Seoul (KR); Tae-joong Song, Seongnam-si (KR); Jae-boong Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/750,501

(22) Filed: Jan. 23, 2020

(65) Prior Publication Data
US 2020/0159984 A1 May 21, 2020

Related U.S. Application Data

(63) Continuation of application No. 15/933,958, filed on Mar. 23, 2018, now Pat. No. 10,579,771.

(30) Foreign Application Priority Data

Jun. 14, 2017 (KR) .................. 10-2017-0075016
Sep. 21, 2017 (KR) .................. 10-2017-0121869

(51) Int. Cl.
*G06F 30/398* (2020.01)
*H01L 27/02* (2006.01)
*H01L 27/118* (2006.01)
*G06F 30/392* (2020.01)

(52) U.S. Cl.
CPC .......... *G06F 30/398* (2020.01); *G06F 30/392* (2020.01); *H01L 27/0207* (2013.01); *H01L 27/11807* (2013.01)

(58) Field of Classification Search
CPC .................................................... G06F 30/398
USPC ........................................................ 716/111
See application file for complete search history.

(56) References Cited

U.S. PATENT DOCUMENTS

| | | | |
|---|---|---|---|
| 7,895,548 B2 | 2/2011 | Lin et al. | |
| 8,001,517 B2 | 8/2011 | Kobayashi | |
| 8,136,072 B2 | 3/2012 | Frederick | |
| 8,217,469 B2 | 7/2012 | Hou et al. | |
| 8,584,052 B2 | 11/2013 | Chen et al. | |
| 8,645,893 B1* | 2/2014 | Yeung | G06F 30/39 716/135 |
| 9,337,099 B1 | 5/2016 | Jain et al. | |

(Continued)

*Primary Examiner* — Suchin Parihar
(74) *Attorney, Agent, or Firm* — Harness, Dickey & Pierce, P.L.C.

(57) ABSTRACT

Provided is an integrated circuit including a plurality of standard cells each including a front-end-of-line (FEOL) region and a back-end-of-line (BEOL) region on the FEOL region, the FEOL region including at least one gate line extending in a first horizontal direction. A BEOL region of a first standard cell among the plurality of standard cells includes an eaves section not overlapping an FEOL region of the first standard cell in a vertical direction, the eaves section protruding in a second horizontal direction perpendicular to the first horizontal direction.

20 Claims, 30 Drawing Sheets

(56) References Cited

U.S. PATENT DOCUMENTS

| | | | |
|---|---|---|---|
| 2015/0097258 A1* | 4/2015 | Shigetoshi | H01L 21/76898 257/432 |
| 2016/0214855 A1* | 7/2016 | Yeh | B81C 1/00246 |
| 2017/0062475 A1 | 3/2017 | Song et al. | |
| 2017/0083653 A1 | 3/2017 | Sahu et al. | |
| 2017/0154848 A1* | 6/2017 | Fan | H01L 21/76816 |
| 2018/0083036 A1* | 3/2018 | Agarwal | H01L 21/823821 |
| 2018/0096090 A1* | 4/2018 | Wu | G06F 30/392 |
| 2018/0232481 A1* | 8/2018 | Berry | G06F 30/394 |
| 2019/0095552 A1* | 3/2019 | Lei | G06F 30/327 |

* cited by examiner

Orientation: +X(→), −X(←)

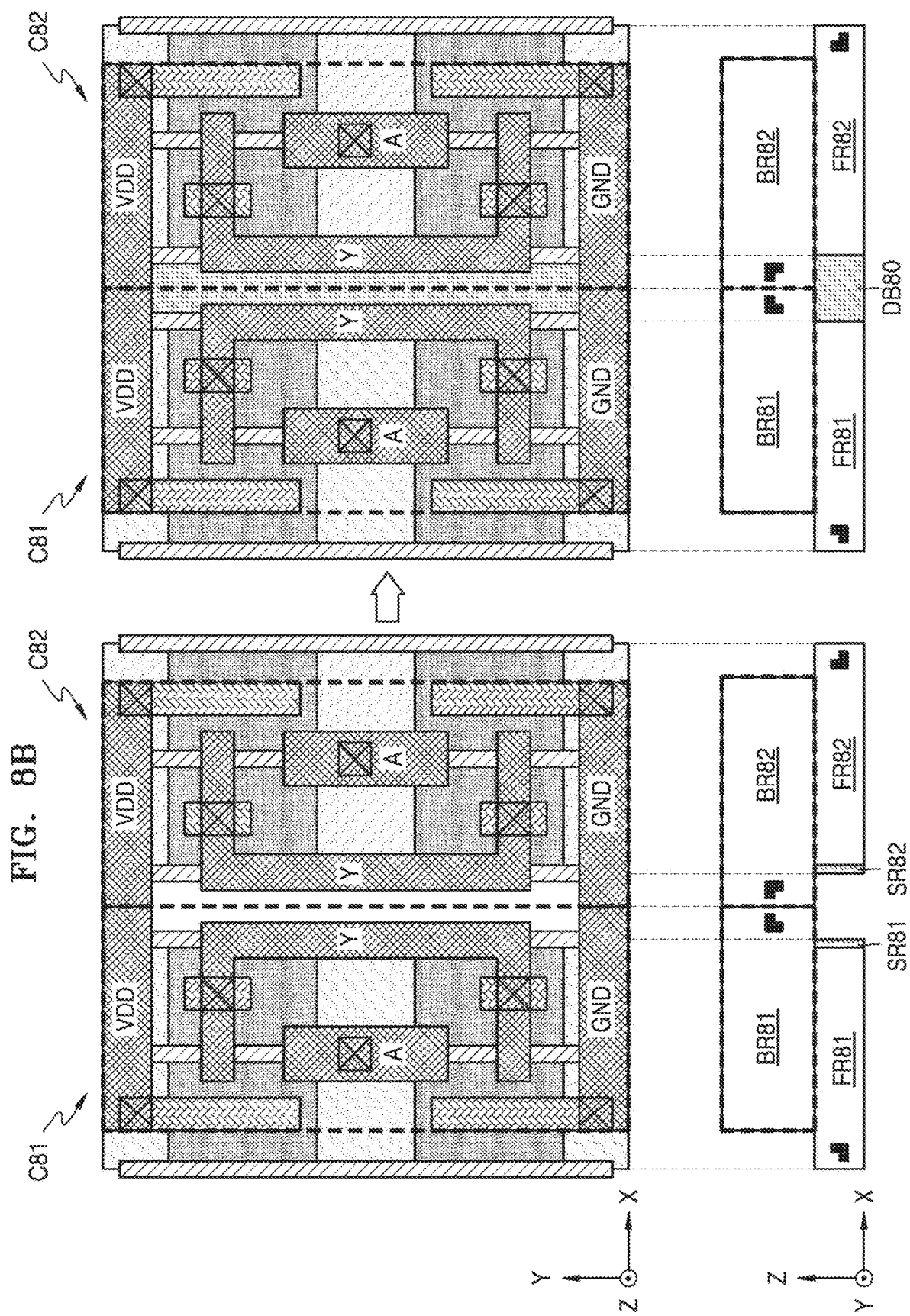

INTEGRATED CIRCUIT INCLUDING STANDARD CELLS OVERLAPPING EACH OTHER AND METHOD OF GENERATING LAYOUT OF THE INTEGRATED CIRCUIT

CROSS-REFERENCE TO RELATED APPLICATIONS

This application is a continuation of U.S. application Ser. No. 15/933,958, filed on Mar. 23, 2018, which claims the benefit of Korean Patent Application Nos. 10-2017-0075016, filed on Jun. 14, 2017 and 10-2017-0121869, filed on Sep. 21, 2017, in the Korean Intellectual Property Office, the disclosures of each of which are incorporated herein in their entirety by reference.

BACKGROUND

Inventive concepts relates to an integrated circuit, and more particularly, to an integrated circuit including a standard cell and a method of generating the layout of the integrated circuit.

With the miniaturization of semiconductor processes, the size of a standard cell included in an integrated circuit may be decreased. The decreased size of a standard cell may lead to an increase in a mutual influence between adjacent standard cells. To prevent or reduce the mutual influence from increasing, a structure, e.g., a diffusion break separating standard cells from each other, may be inserted between the standard cells. Meanwhile, a standard cell may have an unnecessary or undesirable space in particular layers according to the structure thereof. Such a wasted space cancels out the decrease in size of standard cells and may thus restrict an increase in the degree of integration of an integrated circuit.

SUMMARY

Inventive concepts provides an integrated circuit including standard cells overlapping each other and a method of generating the layout of the integrated circuit.

According to some example embodiments of inventive concepts, there is provided an integrated circuit including a plurality of standard cells each including a front-end-of-line (FEOL) region and a back-end-of-line (BEOL) region on the FEOL region, the FEOL region including at least one gate line extending in a first horizontal direction. A BEOL region of a first standard cell among the plurality of standard cells may include an eaves section not overlapping an FEOL region of the first standard cell in a vertical direction, the eaves section protruding in a second horizontal direction perpendicular to the first horizontal direction.

According to some example embodiments of inventive concepts, there is provided an integrated circuit including a plurality of first standard cells each including a first FEOL region and a first BEOL region on the first FEOL region, the first FEOL region including at least one gate line extending in a first horizontal direction, the first standard cells being consecutively placed in a second horizontal direction perpendicular to the first horizontal direction. The first BEOL region of each of the first standard cells may overlap, in a vertical direction, at least part of a first FEOL region of another first standard cell adjacent in the second horizontal direction.

According to some example embodiments of inventive concepts, there is provided a computer implemented method of generating a layout of an integrated circuit. The computer implemented method including accessing a standard cell library defining a plurality of standard cells each including an FEOL region and a BEOL region on the FEOL region, the FEOL region including at least one gate line extending in a first horizontal direction; and placing a standard cell based on the standard cell library. The placing of the standard cell may include placing a second standard cell to be adjacent to a first standard cell in a second horizontal direction perpendicular to the first horizontal direction such that an eaves section of a BEOL region of the first standard cell overlaps a step section of an FEOL region of the second standard cell in a vertical direction, the eaves section protruding in the second horizontal direction, the step section protruding in a direction antiparallel to the second horizontal direction.

According to yet another aspect of inventive concepts, there is provided a computer implemented method of generating a standard cell library defining a plurality of standard cells for generating a layout of an integrated circuit. The computer implemented method includes receiving an input library defining a first standard cell including a first FEOL region and a first BEOL region on the first FEOL region, the first FEOL region including at least one gate line extending in a first horizontal direction and having double diffusion breaks formed at respective opposite sides thereof facing each other in a second horizontal direction perpendicular to the first horizontal direction to extend in the first horizontal direction; and generating an output library defining a second standard cell providing the same function as the first standard cell, the second standard cell including a second FEOL region and a second BEOL region on the second FEOL region, the second FEOL region having single diffusion breaks formed at respective opposite sides thereof facing each other in the second horizontal direction to extend in the first horizontal direction. The output library may define an eaves section of the second BEOL region and a step section of the second FEOL region, the eaves section protruding in the second horizontal direction, the step section protruding in direction antiparallel to the second horizontal direction.

BRIEF DESCRIPTION OF THE DRAWINGS

Embodiments of inventive concepts will be more clearly understood from the following detailed description taken in conjunction with the accompanying drawings in which:

FIGS. 8A and 8B are diagrams of a method of generating a layout of an integrated circuit, according to an example embodiment of inventive concepts;

DETAILED DESCRIPTION OF THE EMBODIMENTS

Hereinafter, embodiments of inventive concepts will be described in detail with reference to the accompanying drawings.

Figure 1:
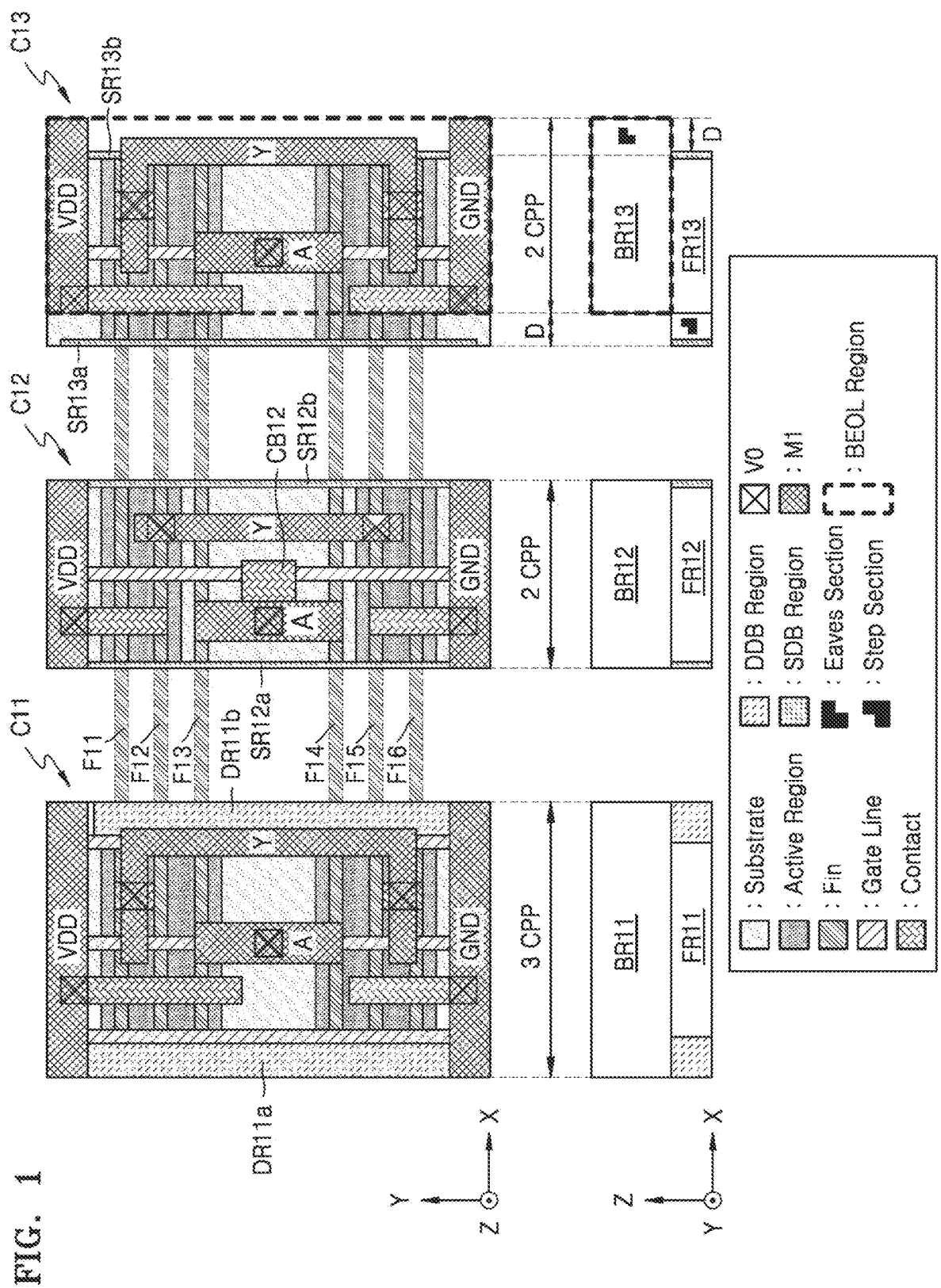
FIG. 1 is a diagram of standard cells according to an example embodiment of inventive concepts.

FIG. 1 is a diagram of standard cells according to an example embodiment of inventive concepts. In detail, first through third standard cells C11, C12, and C13 are inverters having an input pin A and an output pin Y. A plan view of the first through third standard cells C11 through C13 on a plane formed of an X-axis and a Y-axis is shown in the upper portion of FIG. 1. A side view, e.g. a cross-sectional view, of the first through third standard cells C11 through C13 in a Y-axis direction is shown in the lower portion of FIG. 1. Hereinafter, a plane formed of the X- and Y-axes may be referred to as a horizontal plane; elements placed in a +Z direction as compared with other elements may be construed as being on or above the other elements; and elements placed in a −Z direction as compared with other elements may be construed as being below or under the other elements. An area of a particular object may refer to a space occupied by the object on a surface parallel with a horizontal plane.

A standard cell is a layout unit included in an integrated circuit. An integrated circuit may include a plurality of various standard cells. Standard cells may have a structure complying with specific, (or alternatively predetermined) specifications. For example, as shown in FIG. 1, the first through third standard cells C11 through C13 may have a fixed height, e.g. a fixed length in the Y-axis direction, and may include a pair of power rails VDD and GND to which power supply voltages may respectively be applied. The power rails VDD and GND extend in the X-axis direction to be parallel with each other and separated from each other in the Y-axis direction. The first through third standard cells C11 through C13 may also include at least one gate line which extends in the Y-axis direction (or a first horizontal direction) and at least one active region and at least one fin which extend in the X-axis direction (or a second horizontal direction). An active region may include a semiconductor, such as Si or Ge, or a compound semiconductor, such as SiGe, SiC, GaAs, InAs, or InP, and may include a conductive region such as an impurity-doped well and/or an impurity-doped structure. A gate line may include a work function metal layer and a gap fill metal film. For example, a work function metal layer may include at least one metal among Ti, W, Ru, Nb, Mo, Hf, Ni, Co, Pt, Yb, Tb, Dy, Er, and Pd, and a gap fill metal film may include a W film and/or an Al film. Gate lines may have a stack structure of TiAlC/TiN/W, a stack structure of TiN/TaN/TiAlC/TiN/W, and/or a stack structure of TiN/TaN/TiN/TiAlC/TiN/W. Although a fin on an active region is not illustrated in the drawings for convenience's sake, the embodiments of inventive concepts should be construed as applying to a standard cell including a fin field effect transistor (FinFET) as well as a standard cell including a planar transistor.

Referring to FIG. 1, the first through third standard cells C11 through C13 may include a diffusion break as a structure for decreasing a mutual influence with another adjacent standard cell when they are placed in an integrated circuit. A diffusion break may separate active regions or diffusion regions between adjacent standard cells. For example, as shown in FIG. 1, when the first through third standard cells C11 through C13 include a FinFET formed by at least one fin, a diffusion break may separate fins from each other between adjacent standard cells. Differently than shown in FIG. 1, when a standard cell includes a planar transistor, a diffusion break may remove at least part of a diffusion region and/or an active region, thereby separating diffusion regions between adjacent standard cells.

A diffusion break may include a double diffusion break (DDB) and/or a single diffusion break (SDB) according to a structure. For example, a DDB may be formed below two adjacent gate lines or at least three adjacent gate lines. The DDB may have a width, i.e., an X-axis direction length, of about at least 1 contacted poly pitch (CPP) and may extend in the Y-axis direction. An SDB may be formed below a single gate line or in a region from which a single gate line has been removed and may extend in the Y-axis direction. Accordingly, the DDB may separate adjacent standard cells by at least 1 CPP, while the SDB may allow adjacent standard cells to be continuously placed.

As shown in FIG. 1, the first through third standard cells C11 through C13 may include front-end-of-line (FEOL) regions FR11, FR12, and FR13, respectively, formed using an FEOL process and back-end-of-line (BEOL) regions BR11, BR12, and BR13, respectively, formed using a BEOL process. The BEOL regions BR11, BR12, and BR13 may be provided above the FEOL regions FR11, FR12, and FR13, respectively. For example, an FEOL region in a standard cell may include a substrate, an active region, a fin, and a contact structure. A transistor, a diffusion break, etc. may be formed in, e.g. within, the FEOL region. A BEOL region in a standard cell may include a via and a metal layer. An input pin and an output pin of the standard cell and interconnection for internal signals may be formed in the BEOL region.

Although a contact structure connected to a gate line and fins may be formed using a middle-of-line (MOL) process separately from the FEOL process and the BEOL process, herein a contact structure is understood as being included in an FEOL region. In the drawing, a via V0 connecting a contact structure with a pattern of a first metal layer M1 is illustrated on the pattern of the first metal layer M1 for convenience's sake, but the via V0 is may be understood as being between the contact structure and the first metal layer M1.

A DDB may be advantageous in terms of fabricating an integrated circuit by resolving some issues with semiconductor processes but may provide lower spatial efficiency than an SDB. While an SDB may provide higher spatial efficiency than a DDB, the SDB may cause some issues with semiconductor processes and/or may cause the degradation of performance of a standard cell. For example, as shown in FIG. 1, the first standard cell C11 may include DDB regions DR11a and DR11b extending in the Y-axis direction with a width of ½ CPP at respective opposite sides facing each other in the X-axis direction such that DDBs may be formed together with adjacent standard cells. The second standard cell C12 may include SDB regions SR12a and SR12b extending at a position of a gate line in the Y-axis direction at respective opposite sides facing each other in the X-axis direction such that SDBs may be formed together with adjacent standard cells. Accordingly, the first standard cell C11 may have a width (i.e., an X-axis direction length) of 3 CPP and the second standard cell C12 may have a width of 2 CPP.

As shown in FIG. 1, in the case of the second standard cell C12, the output pin Y may be shifted in a −X direction, e.g. in a direction antiparallel to the +X direction, compared to the first standard cell C11, and therefore, the input pin A may also be shifted in the −X direction. A contact structure (or a gate contact) CB12 may extend in the X-axis direction to connect the input pin A with a gate line and may be referred to as an offset contact structure. The contact structure CB12 may have a specific (or, alternatively, predetermined) length in the Y-axis direction, and therefore, the number of fins in an active region may be decreased compared to the first standard cell C11 so that a distance between fins around the contact CB12 and a contact structure (or an active contact structure) connected to the fins may be ensured. In other words, while the first standard cell C11 may include a total of six fins F11 through F16 in an active region, the second standard cell C12 may include a total of four fins F11, F12, F15, and F16 in an active region. Due to the decreased number of fins, the second standard cell C12 may have different characteristics than the first standard cell C11.

According to some example embodiments of inventive concepts, a standard cell may include an eaves section protruding in the X-axis direction in a BEOL region and/or a step section protruding in the X-axis direction in an FEOL region. For example, the third standard cell C13 may include an eaves section (marked with "⌐") of the BEOL region BR13 and a step section (marked with "⌐") of the FEOL region FR13. The eaves section (⌐) and the step section (⌐) of the third standard cell C13 may have a length D in the X-axis direction. Accordingly, the third standard cell C13 may include SDB regions SR13a and SR13b while having the same patterns as the first standard cell C11 including the DDB regions DR11a and DR11b.

In some example embodiments, an eaves section of a standard cell may include the first metal layer M1 and upper layers thereof. For example, a BEOL region including the via V0 and upper layers thereof has a protruding eaves section in the embodiments. However, inventive concepts are not limited thereto. An eaves section may include the first metal layer M1 and upper layers thereof and the via V0 may be in a planar boundary of an FEOL region and may be included in a step section.

As described with reference to FIG. 2A and other drawings below, the eaves section (⌐) of the third standard cell C13 may overlap a step section of an adjacent standard cell in a Z-axis direction, e.g., a vertical direction. Standard cells placed in such a manner may provide increased spatial efficiency and may substantially have the same characteristics as a standard cell (e.g., the first standard cell C11) including a DDB region. In other words, standard cells may have an orientation according to directions in which an eaves section and a step section protrude, and standard cells having the same orientation may be consecutively placed. In addition, the third standard cell C13 may be derived, e.g. easily derived, from the first standard cell C11, as shown in FIG. 1, and therefore, standard cells supporting an SDB may be generated, e.g. easily generated, from standard cells supporting a DDB which have been developed and verified at the initial operational stage of semiconductor processes, as described with reference to FIG. 12 and other drawings below. The increased spatial efficiency may reduce chip size, which may increase the number of available integrated circuits produced on a given substrate. The increased spatial efficiency may increase a manufacturing yield of the integrated circuit. The increased spatial efficiency may reduce a unit cost of manufacturing the integrated circuit.

FIGS. 2A through 2E are diagrams of some standard cells included in an integrated circuit, according to an example embodiment of inventive concepts. In detail, FIGS. 2A through 2E are cross-sectional views of standard cells, taken along the plane formed of the X-axis and the Z-axis, in an integrated circuit. As described above with reference to FIG. 1, "⌐" or "¬" marks an eaves section of a BEOL region and "⌐" or "⌐" marks a step section of an FEOL region.

Figure 2A:
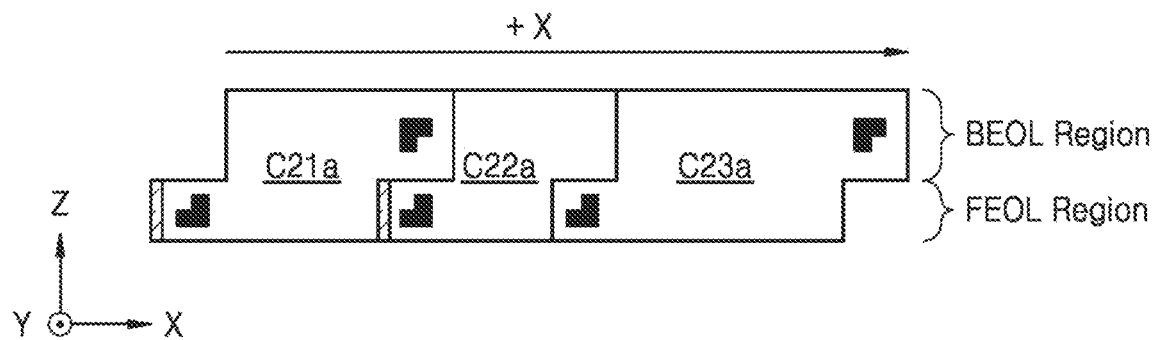
FIGS. 2A through 2E are diagrams of some standard cells included in an integrated circuit, according to an example embodiment of inventive concepts.

Referring to FIG. 2A, standard cells may be placed such that an eaves section of a standard cell overlaps a step section of an adjacent standard cell in the Z-axis direction (or the vertical direction). For example, as shown in FIG. 2A, an eaves section (⌐) of a first standard cell C21a may overlap a step section (⌐) of a second standard cell C22a in the Z-axis direction and an eaves section (⌐) of the second standard cell C22a may overlap a step section (⌐) of a third standard cell C23a in the Z-axis direction. As shown in FIG. 2A, for the placement of a succession of standard cells, each standard cell may have an eaves section (⌐) and a step section (⌐) respectively protruding in antiparallel, e.g. opposite, directions. Herein antiparallel may mean parallel but oriented in opposite directions. For example, the first through third standard cells C21a through C23a may have an eaves section (⌐) protruding in a +X direction and a step section (⌐) protruding in a −X direction. Herein a standard cell (e.g., C21a, C22a, or C23a) having an eaves section protruding in the +X direction and a step section protruding in the −X direction is understood as having a +X orientation and that a standard cell (e.g., C23b in FIG. 2B) having an eaves section protruding in the −X direction and a step section protruding in the +X direction is understood as having a −X orientation.

In some embodiments, an SDB may be formed between FEOL regions of respective standard cells placed with the +X orientation. For example, as shown in FIG. 2A, an SDB may be formed between an FEOL region of the first standard cell C21a and an FEOL region of the second standard cell C22a, and the SDB may extend in the Y-axis direction.

Meanwhile, as shown in the FEOL regions of the second and third standard cells C22a and C23a, active regions and/or fins of adjacent standard cells may be connected with each other with no diffusion break therebetween. Although an SDB is not shown at a boundary of a standard cell or between FEOL regions of adjacent standard cells in the drawings, an SDB may be understood as being formed at a border between FEOL regions of adjacent standard cells.

Figure 2B:
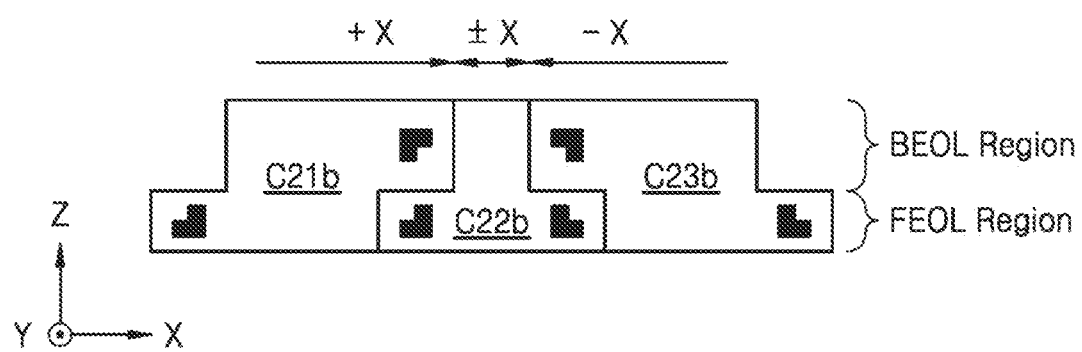

Referring to FIG. 2B, a standard cell changing an orientation may be between standard cells having different orientations in some embodiments. For example, a second standard cell C22b may be between a first standard cell C21b having the +X orientation and the third standard cell C23b having the −X orientation. The second standard cell C22b may have a step section (⌋) protruding in the −X direction and a step section (⌊) protruding in the +X direction and the step sections (⌋, ⌊) of the second standard cell C22b may respectively overlap an eaves section (⌈) of the first standard cell C21b and an eaves section (¬) of the third standard cell C23b in the Z-axis direction. Accordingly, the orientation of standard cells may be changed through the second standard cell C22b. A standard cell like the second standard cell C22b which changes the orientation of standard cells may be understood as having a ±X orientation and is referred to as a convergence cell. The second standard cell C22b may provide an output signal by processing an input signal like a third standard cell C53 shown in FIG. 5B and may also be a filler cell like fourth and fifth standard cells C54 and C55 shown in FIG. 5B.

Figure 2C:
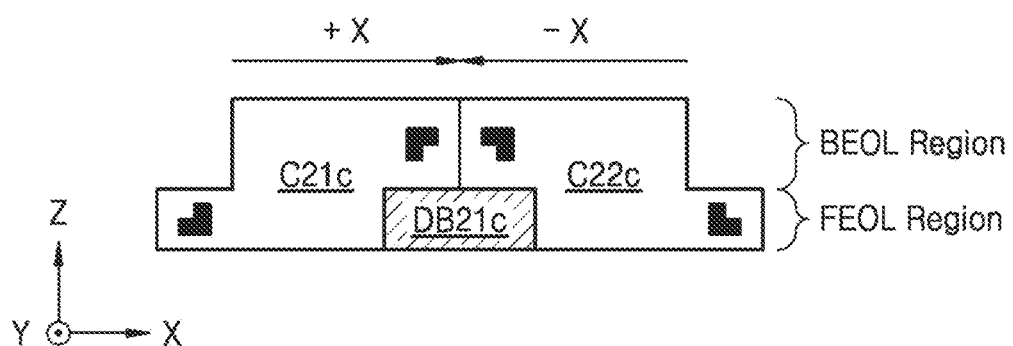

Referring to FIG. 2C, a DDB may be formed at a portion where the orientation of standard cells is changed in some embodiments. For example, a first standard cell C21c and a second standard cell C22c may be placed such that an eaves section (⌈) of the first standard cell C21c having the +X orientation is adjacent to an eaves section (¬) of the second standard cell C22c having the −X orientation. Accordingly, a DDB DB21c may be below the eaves sections (¬, ⌈) of the first and second standard cells C21c and C22c, i.e., an empty space between FEOL regions of the first and second standard cells C21c and C22c. Although BEOL regions of the first and second standard cells C21c and C22c are shown as being in contact, e.g. in direct contact, with each other in FIG. 2C, BEOL regions of respective standard cells having different orientations, e.g. extending in directions antiparallel to one another, may be separated from each other such that a distance between FEOL regions of the respective standard cells is a width (e.g., 1 CPP) of a DDB.

Figure 2D:
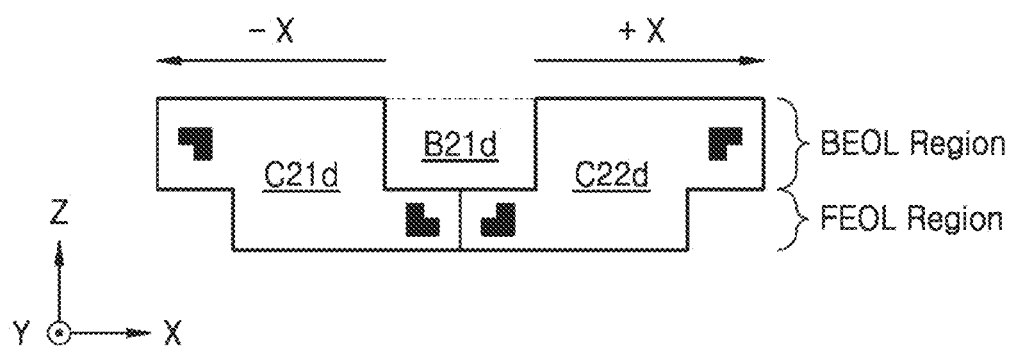

Referring to FIG. 2D, standard cells may be placed such that standard cells respectively having step sections protruding in different directions, respectively, are in contact with each other in some embodiments. For example, as shown in FIG. 2D, a first standard cell C21d and a second standard cell C22d may be placed such that a step section (⌊) of the first standard cell C21d having the −X orientation is adjacent to a step section (⌋) of the second standard cell C22d having the +X orientation. Accordingly, a space B21d may be formed between BEOL regions of the first and second standard cells C21d and C22d, i.e., above FEOL regions (⌊, ⌋) of the first and second standard cells C21d and C22d, and the space B21d in a BEOL region may include patterns connecting power rails of the first and second standard cells C21d and C22d.

Figure 2E:
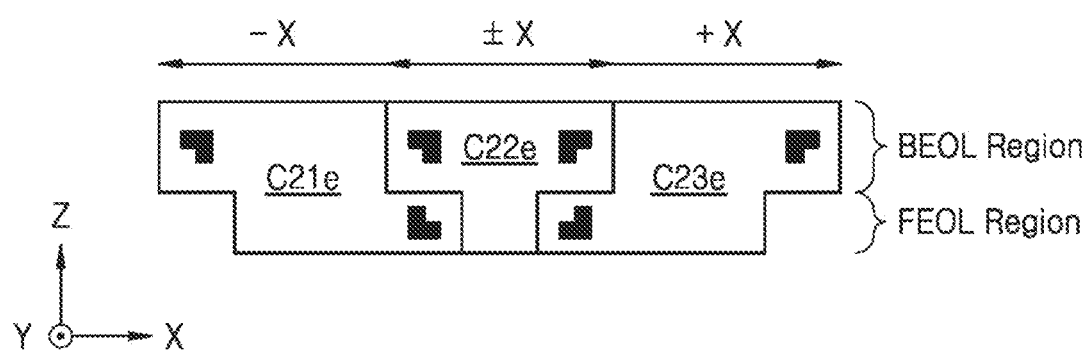

Referring to FIG. 2E, similarly to the embodiments illustrated in FIG. 2B, a standard cell changing an orientation may be between standard cells having different orientations in some embodiments. For example, a second standard cell C22e may be between a first standard cell C21e having the −X orientation and a third standard cell C23e having the +X orientation. The second standard cell C22e may have an eaves section (¬) protruding in the −X direction and an eaves section (⌈) protruding in the +X direction, and the eaves sections (¬, ⌈) of the second standard cell C22e may respectively overlap a step section (⌊) of the first standard cell C21e and a step section (⌋) of the third standard cell C23e in the Z-axis direction. Accordingly, the orientation of standard cells may be changed through the second standard cell C22e. The second standard cell C22e may be assumed to have the ±X orientation and may be referred to as a divergence cell. Similarly to the second standard cell C22b shown in FIG. 2B, the second standard cell C22e may provide an output signal by processing an input signal and may also be a filler cell.

Figure 3:
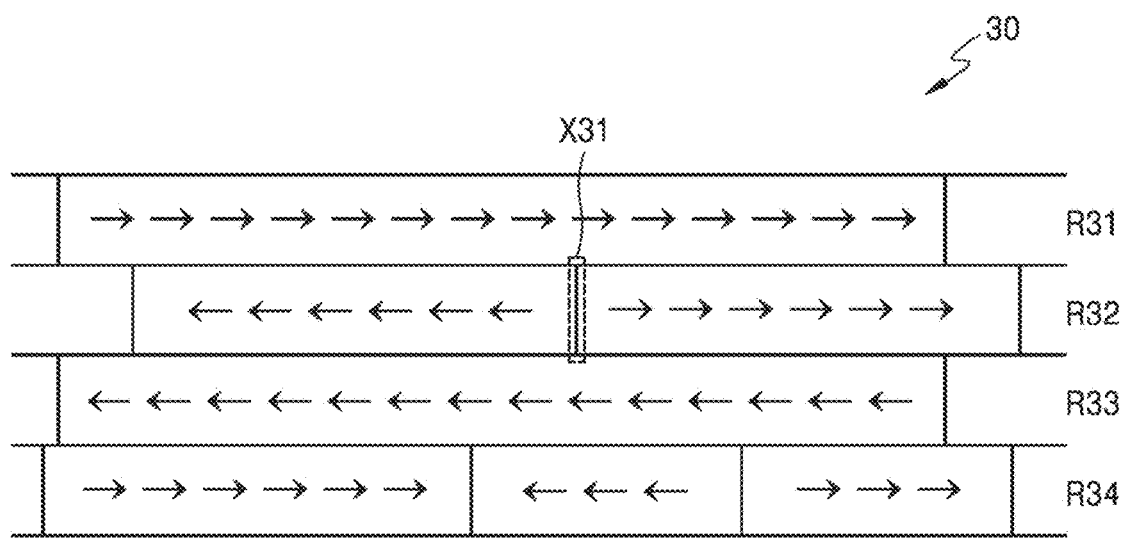
FIG. 3 is a schematic diagram of part of an integrated circuit, according to an example embodiment of inventive concepts.
Figure 3:
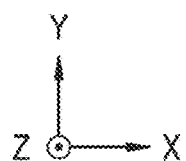

FIG. 3 is a schematic diagram of part of an integrated circuit 30 shown in plan view, according to an example embodiment of inventive concepts. As described above with reference to FIG. 1, the integrated circuit 30 may include a plurality of standard cells, and the standard cells may have a fixed height, e.g., fixed length in the Y-axis direction. As described with reference to FIG. 3 below, the integrated circuit 30 may include a plurality of standard cells which have the same orientation and are consecutively placed, thereby preventing or reducing the likelihood of performance degradation of the standard cells and providing increased spatial efficiency. The increased spatial efficiency may reduce chip size, which may increase the number of available integrated circuits produced on a given substrate. The increased spatial efficiency may increase a manufacturing yield of the integrated circuit. The increased spatial efficiency may reduce a unit cost of manufacturing the integrated circuit.

In some example embodiments, the integrated circuit 30 may include consecutively-placed standard cells having the same orientation. For example, as shown in FIG. 3, standard cells placed in a first row R31 may have the +X orientation (marked with "→") and may have an eaves section protruding in the +X direction and a step section protruding in the −X direction, that is, a direction antiparallel to the +X direction. Accordingly, a BEOL region (e.g., an eaves section) of one standard cell may overlap, in the Z-axis direction, an FEOL region (e.g., a step section) of another standard cell adjacent in the +X direction in the first row R31. Similarly, standard cells placed in a third row R33 may have the −X orientation (marked with "←") and may have an eaves section protruding in the −X direction and a step section protruding in the +X direction. Accordingly, a BEOL region (e.g., an eaves section) of one standard cell may overlap, in the Z-axis direction, an FEOL region (e.g., a step section) of another standard cell adjacent in the −X direction in the third row R33.

In some example embodiments, the integrated circuit 30 may include standard cells having different orientations in one row. For example, as shown in FIG. 3, the integrated circuit 30 may include a series of standard cells having the −X orientation (←) and a series of standard cells having the +X orientation (→) in a second row R32, the −X orientation and the +X orientation being antiparallel to one another. The integrated circuit 30 may include a standard cell (e.g., C22e in FIG. 2E), which changes an orientation, at a spot X31 where standard cells having different orientations meet and may include patterns connecting power rails of adjacent standard cells. Similarly, standard cells having the −X orientation (←) may be between standard cells having the +X orientation (→) in a fourth row R34.

Figure 4:
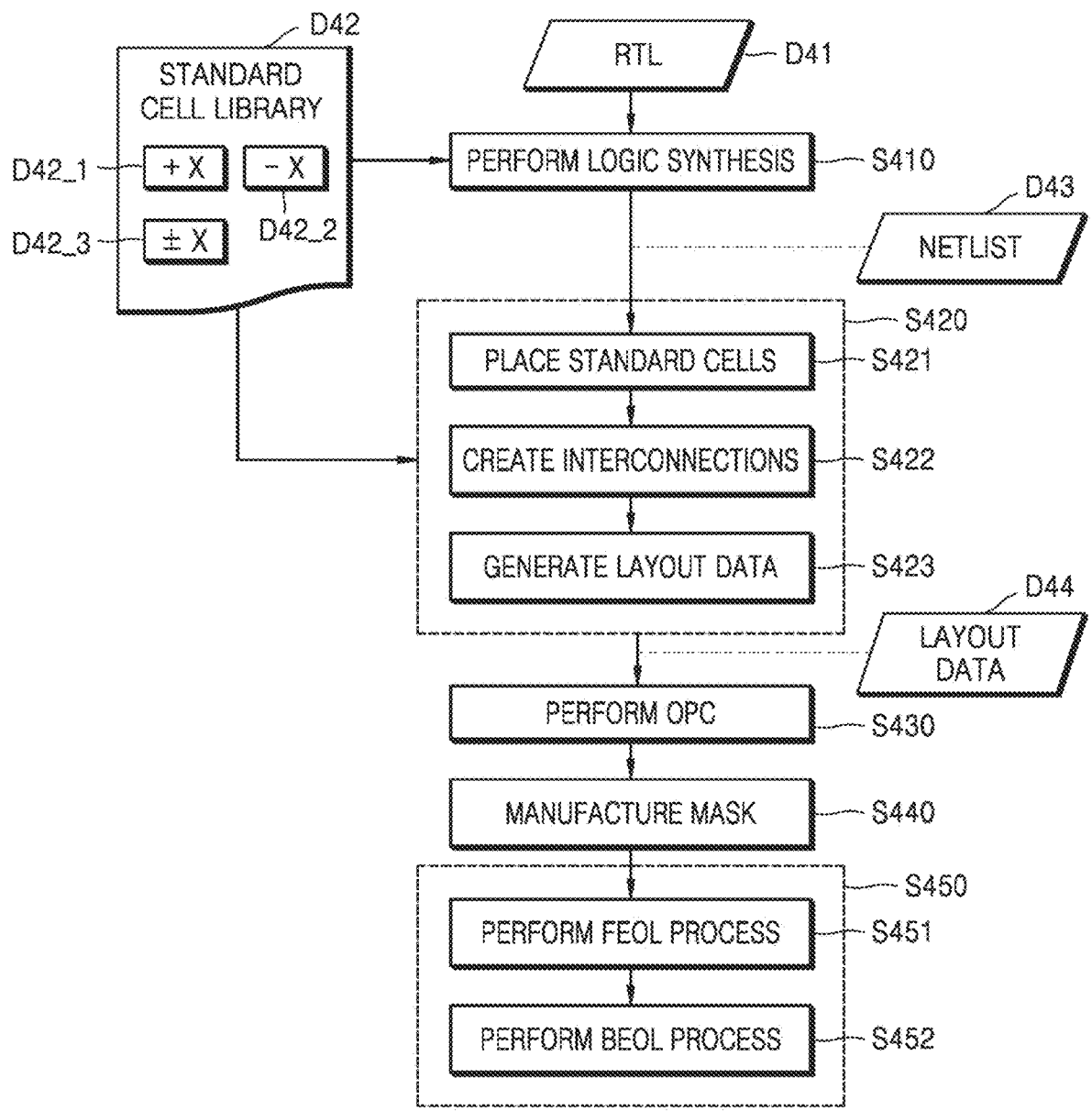
FIG. 4 is a flowchart of a method of fabricating an integrated circuit including a plurality of standard cells, according to an example embodiment of inventive concepts.

FIG. 4 is a flowchart of a method of fabricating an integrated circuit including a plurality of standard cells, according to an example embodiment of inventive concepts.

A standard cell library D42 may include information about a plurality of standard cells, e.g., function information, characteristic information, and layout information. As shown in FIG. 4, the standard cell library D42 may define a first group D42_1 including standard cells having the +X orientation, a second group D42_2 including standard cells having the –X orientation, and a third group D42_3 including standard cells having the ±X orientation.

Logic synthesis may be performed to generate netlist data D43 from register transfer level (RTL) data D41 in operation S410. For example, a semiconductor design tool (e.g., a logic synthesis tool) may perform logic synthesis based on the RTL data D41 written in hardware description languages (HDLs), such as very high speed integrated circuit (VHSIC) HDL (VHDL) and/or Verilog, referring to the standard cell library D42, thereby generating the netlist data D43 including a bitstream or a netlist. The standard cell library D42 may define a plurality of standard cells that provide the same function and have different orientations and/or may define a plurality of standard cells that have the same function and orientation and different boundary structures. Accordingly, standard cells may provide the same function while having different characteristics and the standard cell library D42 may include information about the characteristics of the standard cells. Referring to such information, standard cells may be included in an integrated circuit during logic synthesis.

Placement and routing (P&R) may be performed to generate layout data D44 from the netlist data D43 in operation S420. As shown in FIG. 4, P&R may include a plurality of operations S421, S422, and S423.

Standard cells may be placed in operation S421. For example, a semiconductor design tool (e.g., a P&R tool) may place a plurality of standard cells based on the netlist data D41, referring to the standard cell library D42. As described above, the standard cells may have an orientation, and therefore, the semiconductor design tool may place the standard cells based on the orientation of each standard cell. For example, the semiconductor design tool may place standard cells based on the orientation of each standard cell such that an FEOL region of a standard cell overlaps a BEOL region of an adjacent standard cell in the vertical direction. In addition, after the standard cells are placed according to the boundary structures thereof defined in the standard cell library D42, a diffusion break, e.g., a DDB or an SDB, may be placed between adjacent standard cells.

Interconnections may be created in operation S422. An interconnection may electrically connect an output pin with an input pin in a standard cell and may include, for example, at least one contact structure or via and at least one conductive pattern. The standard cells may be routed by creating the interconnections. For example, referring to FIG. 2D, interconnections connecting power rails of the first and second standard cells C21d and C22d may be formed in the space B21d in the BEOL region.

The layout data D44 may be generated in operation S423. The layout data D44 may be in a format, e.g., Graphics Database System II (GDSII), and may include geometric information of standard cells and interconnections.

Optical proximity correction (OPC) may be performed in operation S430. The OPC may refer to an operation of forming a pattern in a specific, e.g. desired, shape by correcting distortion, such as diffraction, caused by the characteristics of light in photolithography included in semiconductor processes for fabricating an integrated circuit. A pattern on a mask may be determined by applying the OPC to the layout data D44. In some example embodiments, the layout of an integrated circuit may be restrictively changed in operation S430. For example, at least one operation included in any one of methods of generating a layout of an integrated circuit described with reference to FIGS. 8A through 11B below may be included in operation S420 in some embodiments or may be included in operation S430 in other example embodiments. Restrictively changing the integrated circuit in operation S430 may be a post-treatment for improving, e.g. optimizing, the structure of the integrated circuit and may be referred to as design polishing.

A mask may be manufactured in operation S440. For example, patterns on a mask may be defined by applying the OPC to the layout data D30, and at least one mask (or photomask) for forming patterns on each of a plurality of layers may be manufactured. The at least one mask may include the patterns corresponding to the layout data D30.

An integrated circuit may be fabricated in operation S450. For example, the integrated circuit may be fabricated by patterning the layers using the at least one mask manufactured in operation S440. As shown in FIG. 4, operation S450 may include operations S451 and S452.

An FEOL process may be performed in operation S451. FEOL processing may refer to a process of forming individual elements, e.g., a transistor, a capacitor, and a resistor, on a substrate during the fabrication of the integrated circuit. For example, FEOL processing may include wafer planarization and cleaning, formation of a trench, formation of a well, formation of a gate line, and/or formation of a source and a drain. FEOL processing may include photolithography, deposition, dry etching, cleaning, ion implantation, and/or other unit processes; however, inventive concepts are not limited thereto. Photolithography may include patterning a substrate using at least one mask manufactured in operation S440. Here, a portion formed using the FEOL process may be referred to as an FEOL region and may include, for example, an active region, a diffusion region, a gate line, and a contact structure.

A BEOL process may be performed in operation S452. BEOL processing may refer to a process of interconnecting individual elements, e.g., a transistor, a capacitor, and a resistor, during the fabrication of the integrated circuit. For example, BEOL may include silicidation of gate, source, and drain regions, addition of a dielectric, planarization, formation of a hole, addition of a metal layer, formation of a via, and formation of a passivation layer. BEOL processing may include photolithography, deposition, etching, planarization, electroplating, etc.; however, inventive concepts are not limited thereto. Photolithography may include patterning a substrate using at least one mask manufactured in operation S440. Here, a portion formed using the BEOL process may be referred to as a BEOL region and may include, for example, a via and a metal layer pattern. Thereafter, the integrated circuit may be packaged into a semiconductor package and used as a component of various applications.

Figure 5A:
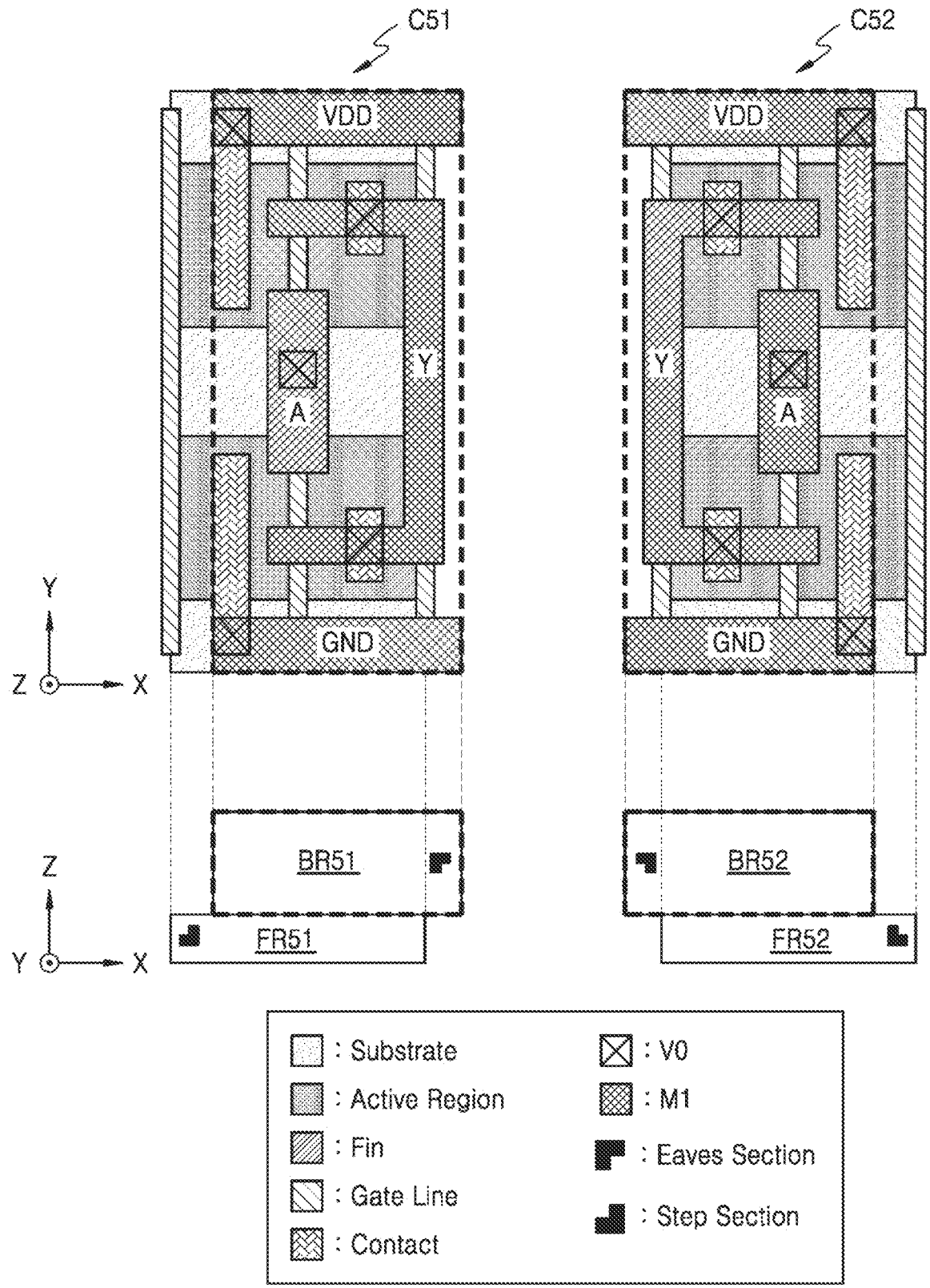
FIGS. 5A and 5B are diagrams of examples of standard cells defined by a standard cell library shown in FIG. 4, according to an example embodiment of inventive concepts.
Figure 5B:
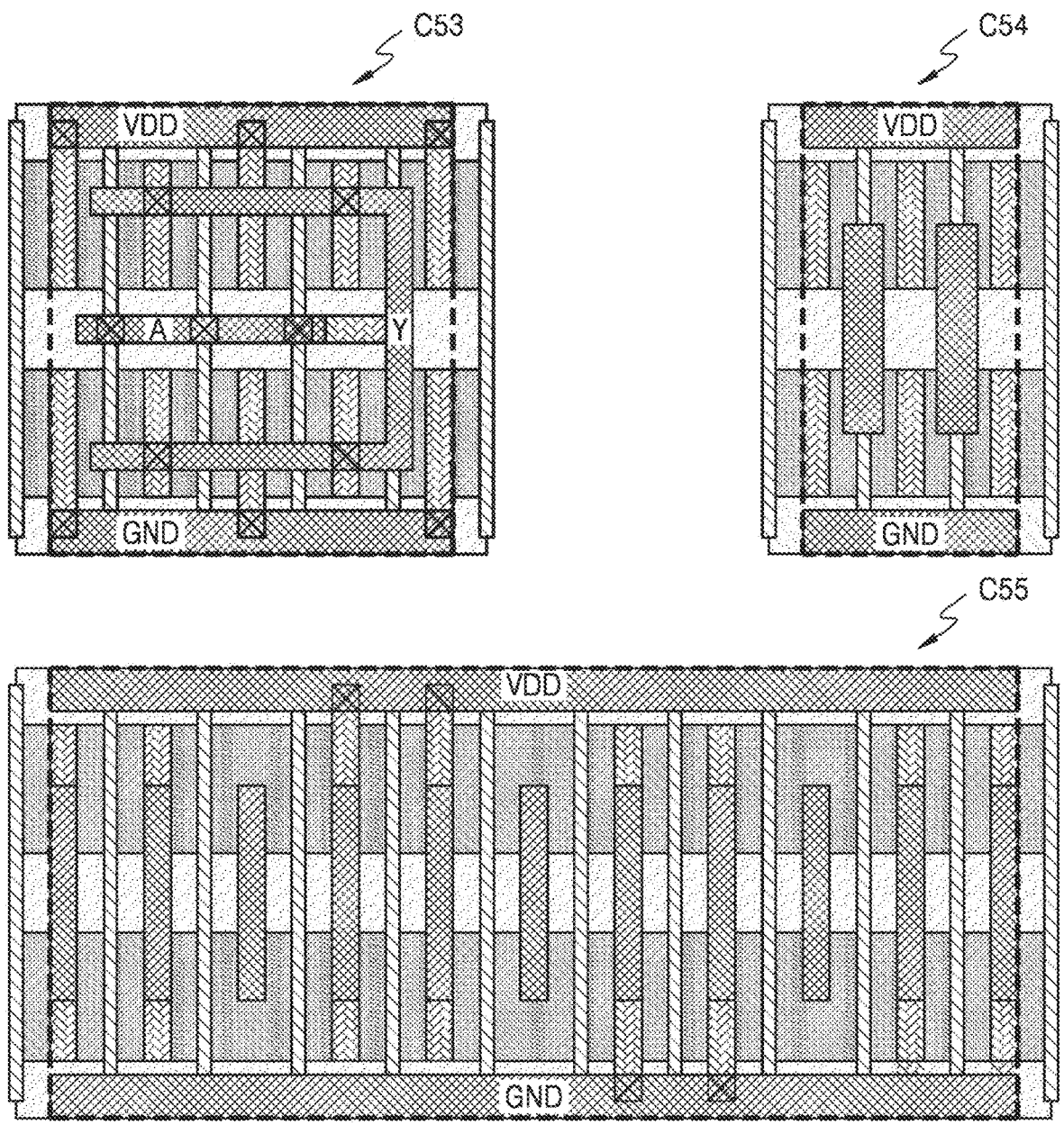

FIGS. 5A and 5B are diagrams of examples of standard cells defined by the standard cell library D42 shown in FIG. 4, according to an example embodiment of inventive concepts. In detail, FIG. 5A shows standard cells respectively included in the first and second groups D42_1 and D42_2 of the standard cell library D42 and FIG. 5B shows standard cells included in the third group D42_3 of the standard cell library D42. As described above with reference to FIG. 4, the first group D42_1 may include standard cells having the +X orientation, the second group D42_2 may include standard cells having the −X orientation, and the third group D42_3 may include standard cells having the ±X orientation. Hereinafter, FIGS. 5A and 5B are described with reference to FIG. 4.

Referring to FIG. 5A, the standard cell library D42 may define standard cells that provide the same inverter function and have different orientations. For example, as shown in FIG. 5A, a first standard cell C51 and a second standard cell C52 may provide the same function as an inverter including the input pin A and the output pin Y, but may have different orientations. In other words, the first standard cell C51 may be included in the first group D42_1 of the standard cell library D42 and may have an eaves section (⌐) protruding in the +X direction in a BEOL region BR51 and a step section (⌐) protruding in the −X direction in an FEOL region FR51. The second standard cell C52 may be included in the second group D42_2 of the standard cell library D42 and may have an eaves section (¬) protruding in the −X direction in a BEOL region BR52 and a step section (⌐) protruding in the +X direction in an FEOL region FR52.

The standard cell library D42 may classify standard cells that provide the same function but have different structures into a same functional group. Standard cells in one same functional group may have different orientations, may have different boundary structures, as described with reference to FIG. 6 below, and/or may have different pin placements, as described with reference to FIG. 10B below. Standard cells having different orientations in one same functional group may be symmetrical. For example, as shown in FIG. 5A, the first and second standard cells C51 and C52 may be symmetrical with respect to an axis parallel with the Y-axis.

Referring to FIG. 5B, the standard cell library D42 may define standard cells included in the third group D42_3. For example, a third standard cell C53 may be an inverter having a higher driving strength than the first and second standard cells C51 and C52 shown in FIG. 5A. Fourth and fifth standard cells C54 and C55 may be filler cells and may be placed in a space remaining after standard cells having a unique function, e.g., a function of generating an output signal by processing an input signal, are placed. As shown in FIG. 5B, standard cells which have the ±X orientation and have an FEOL region larger than a BEOL region may have relatively fewer input and output pins or relatively fewer metal layer patterns compared to the number of gate lines. The standard cells having the ±X orientation and an FEOL region larger than a BEOL region may include a function cell having a relatively higher driving strength and a non-function cell. Although, similarly to the second standard cell C22b shown in FIG. 2B, standard cells having an FEOL region larger than a BEOL region are illustrated in FIG. 5B, the third group D42_3 may also be understood as including standard cells having a BEOL region larger than an FEOL region, such as the second standard cell C22e shown in FIG. 2E and a seventh standard cell C97 shown in FIG. 9C.

Figure 6:
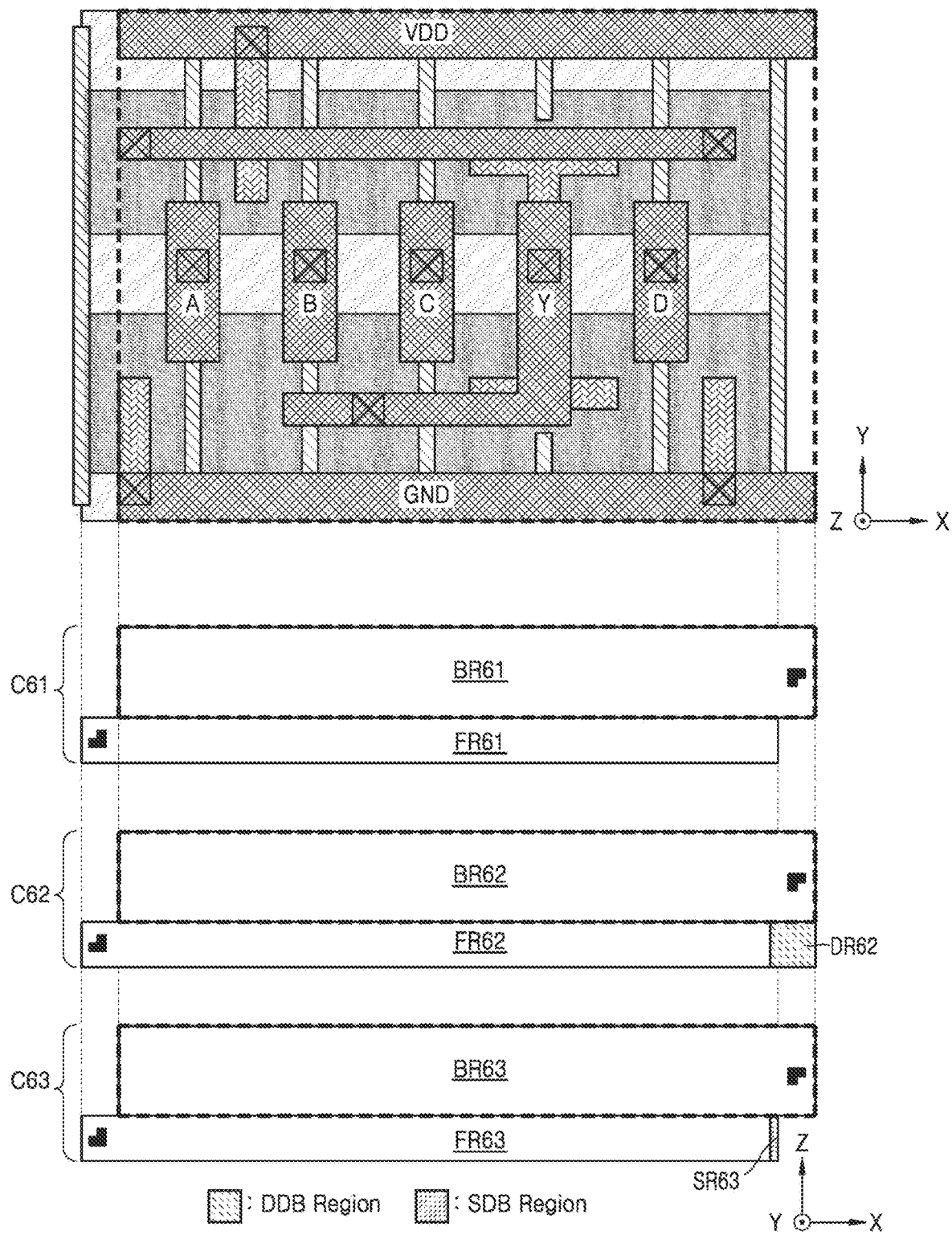
FIG. 6 is a diagram of other examples of standard cells defined by the standard cell library shown in FIG. 4, according to an example embodiment of inventive concepts.

FIG. 6 is a diagram of other examples of standard cells defined by the standard cell library D42 shown in FIG. 4, according to an example embodiment of inventive concepts. As described above with reference to FIGS. 5A and 5B, the standard cell library D42 may define standard cells included in a same functional group in which the standard cells provide the same function but have different structures.

Referring to FIG. 6, the standard cell library D42 may define standard cells which provide the same function but have different boundary structures. For example, first through third standard cells C61 through C63 may provide the same function as standard cells which include input pins A, B, C, and D and the output pin Y, as illustrated in a plan view shown in the upper portion of FIG. 6, but may have different boundary structures, as illustrated in side views shown in the lower portion of FIG. 6.

The first through third standard cells C61 through C63 may have eaves sections (⌐), respectively, protruding in the +X direction in BEOL regions BR61, BR62, and BR63, respectively, and may have step sections (⌐), respectively, protruding in the −X direction in FEOL regions FR61, FR62, and FR63, respectively, thereby having the same orientation, i.e., the +X orientation. Meanwhile, the first through third standard cells C61 through C63 may have different boundary structures in the FEOL regions FR61, FR62, and FR63. In more detail, the first standard cell C61 may have a boundary structure (e.g., no diffusion break) for connecting the FEOL region FR61 with an FEOL region of another standard cell adjacent in the +X direction, e.g., connecting active regions and fins with each other. The second standard cell C62 may include a DDB region DR62, in which a DDB separates the FEOL region FR62 from an FEOL region of another standard cell adjacent in the +X direction, at a side of the FEOL region FR62. The third standard cell C63 may include an SDB region SR63, in which an SDB separates the FEOL region FR63 from an FEOL region of another standard cell adjacent in the +X direction, at a side of the FEOL region FR63. Accordingly, when the standard cells are placed in operation S421 shown in FIG. 4, appropriate standard cells may be selected from among standard cells in a same functional group defined in the standard cell library D42, based on the boundary structures of standard cells placed to be adjacent to each other. Although only three standard cells C61 through C63 having different boundary structures are shown in FIG. 6, additional standard cells may also be understood as being available according to combinations of different boundary structures (e.g., no diffusion break, DDB, and SDB) at opposite sides of an FEOL region.

Figure 7:
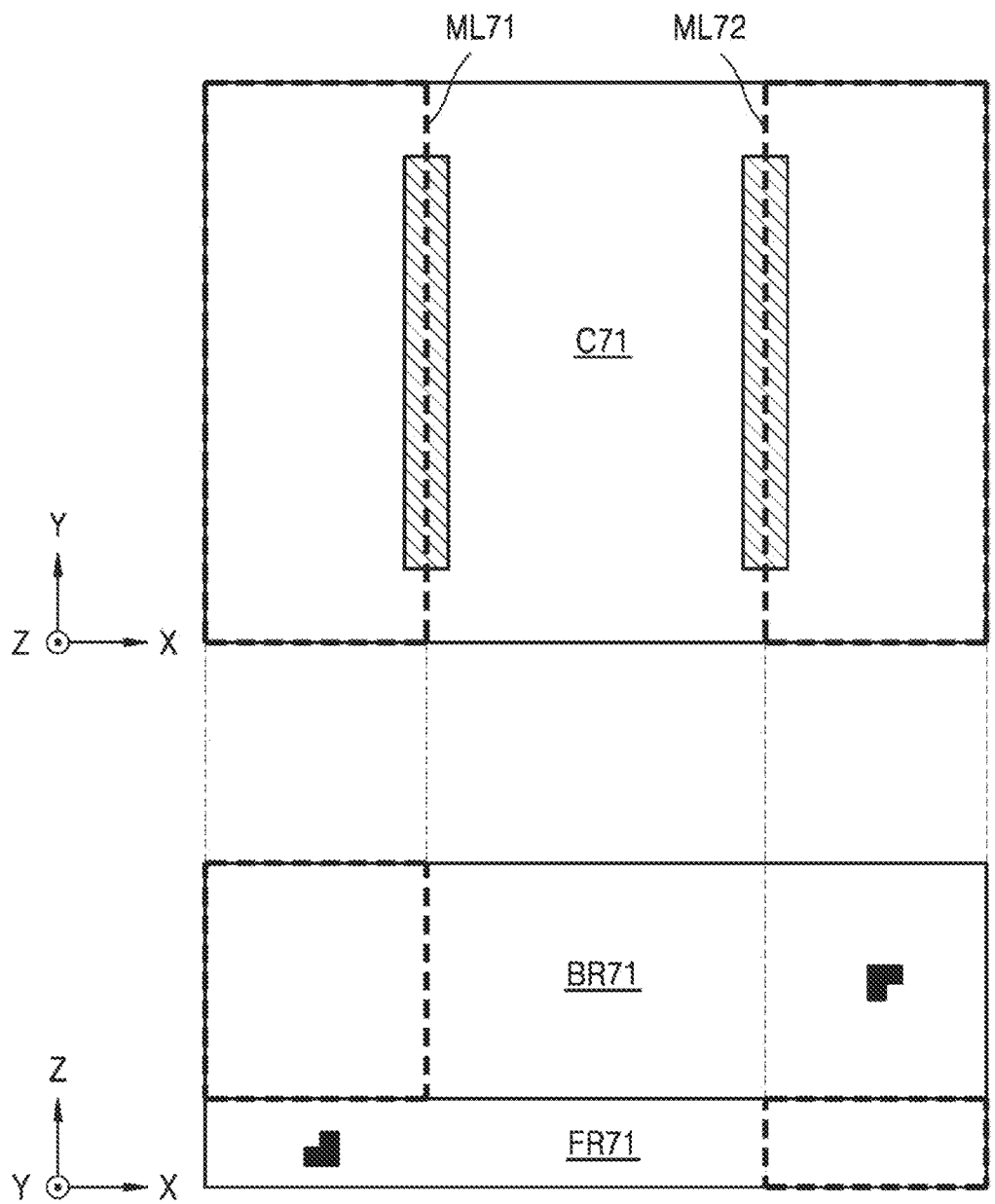
FIG. 7 is a diagram of an example of a standard cell defined by a standard cell library, according to an example embodiment of inventive concepts.

FIG. 7 is a diagram of an example of a standard cell defined by a standard cell library, according to an example embodiment of inventive concepts.

The standard cell library may define an orientation of a standard cell in various ways. In some embodiments, the standard cell library may define the shape of a BEOL region and the shape of an FEOL region in a standard cell according to an orientation. For example, the standard cell library may differently define, on a plane, the boundary of a BEOL region and the boundary of an FEOL region in a standard cell by defining the shape of an eaves section and the shape of a step section. In some example embodiments, the standard cell library may define a standard cell having an orientation using a virtual layer. For example, as shown in FIG. 7, the standard cell library may define that the boundary of a BEOL region BR71 of a first standard cell C71 is the same as the boundary of an FEOL region FR71 of the first standard cell C71 on a plane, and may mark portions to be respectively removed from the BEOL region BR71 and the FEOL region FR71 with marking layers ML71 and ML72, respectively. When standard cells are placed (e.g., in operation S421 in FIG. 4), the marking layers ML71 and ML72 may be recognized by a P&R tool, so that the P&R tool may recognize the orientation of the first standard cell C71. Examples of an operation of generating a layout of an integrated circuit, referring to a standard cell library defining standard cells, will be described with reference to the drawings below.

Figure 8A:
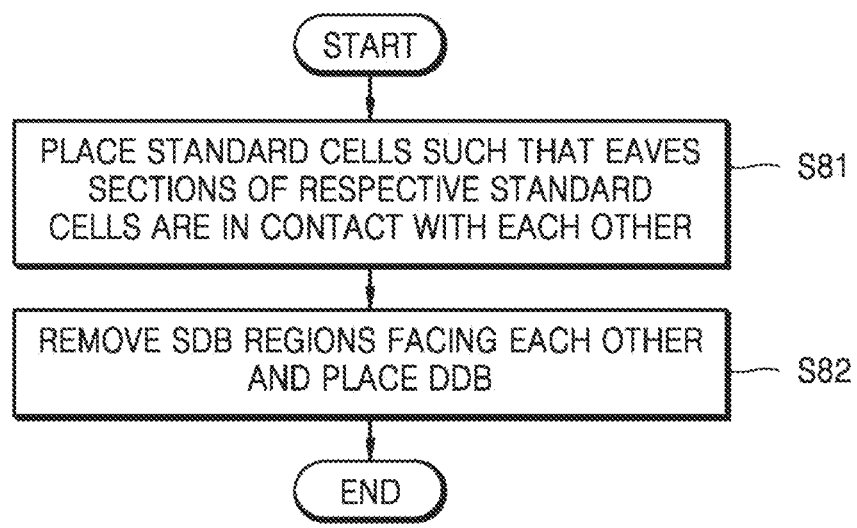

FIG. 8A is a flowchart of a method of generating a layout of an integrated circuit including standard cells which have different orientations and are placed adjacent to each other, according to an example embodiment of inventive concepts.

FIG. 8B is a diagram of an example of the layout generated using the method illustrated in FIG. 8A. According to some embodiments of inventive concepts, standard cells having different orientations may be placed adjacent to each other, and the boundary structure of the standard cells may be changed.

Referring to FIG. 8A, standard cells may be placed such that eaves sections of the respective standard cells are in contact, e.g. in direct contact, with each other in operation S81. For example, as shown in the left of FIG. 8B, a first standard cell C81 having the +X orientation and a second standard cell C82 having the −X orientation may be placed adjacent to each other. The first and second standard cells C81 and C82 may respectively include SDB regions SR81 and SR82, for forming an SDB, at a side of an FEOL region FR81 and a side of an FEOL region FR82, respectively. A BEOL region BR81 of the first standard cell C81 may be in contact, e.g. in direct contact, with a BEOL region BR82 of the second standard cell C82. Accordingly, a space is formed between the FEOL regions FR81 and FR82.

Referring back to FIG. 8A, SDB regions facing each other may be removed and a DDB may be placed in operation S82. For example, as shown in the right of FIG. 8B, the SDB regions SR81 and SR82 may be removed from the sides of the FEOL regions FR81 and FR82 of the first and second standard cells C81 and C82, and a DDB DB80 may be placed between the FEOL regions FR81 and FR82. Accordingly, the DDB DB80, which may be more advantageous than an SDB in terms of semiconductor processes, may be generated without influencing the performance of the first and second standard cells C81 and C82. The removing of the SDB regions SR81 and SR82 and the placement of the DDB DB80 may be performed after the placement (for example, during P&R) of the first and second standard cells C81 and C82 and/or may be performed on the layout (for example, during design polishing) of the integrated circuit after routing is completed. For example, operation S82 shown in FIG. 8A may be included in operation S420 or S430 shown in FIG. 4.

Figure 9A:
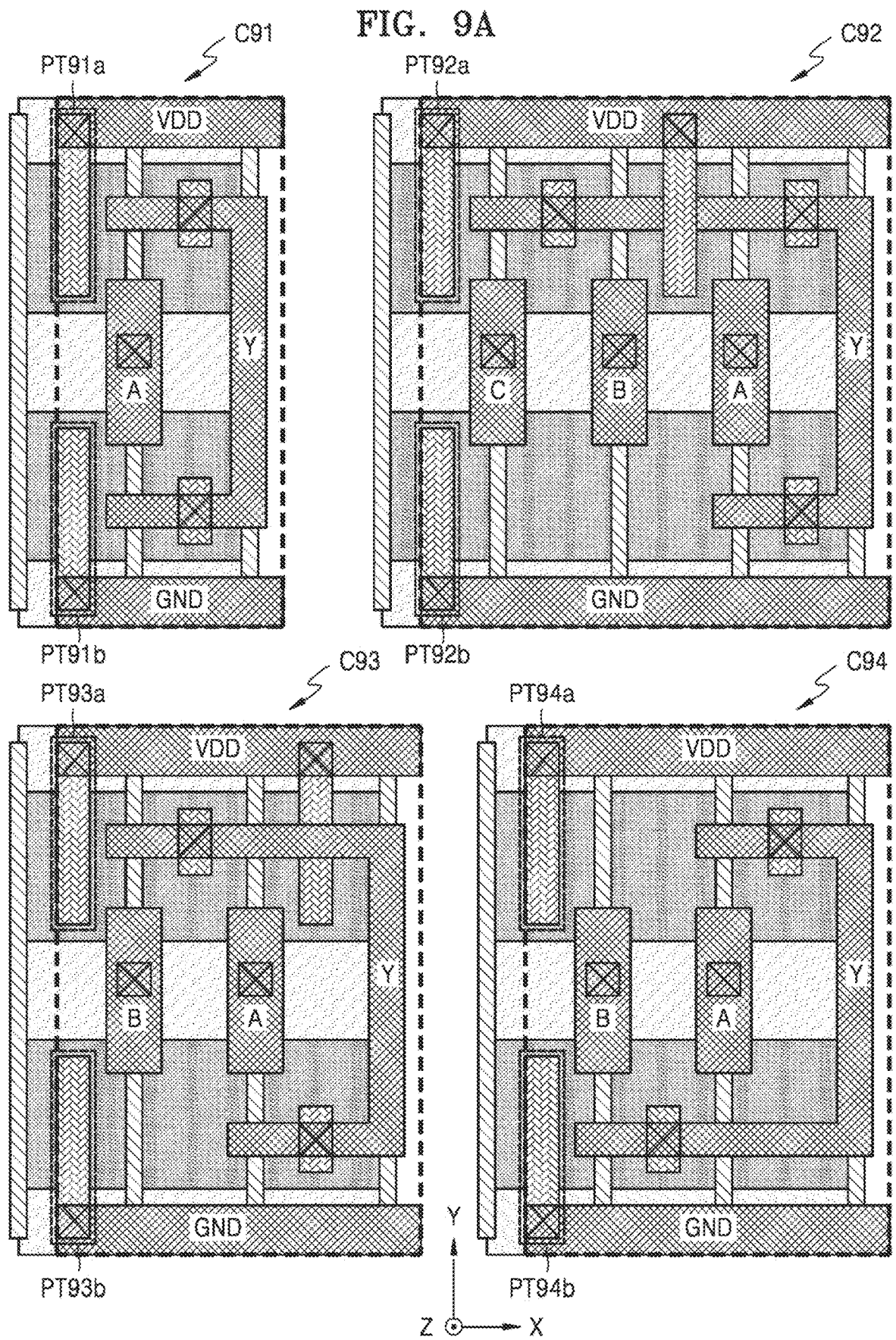
FIGS. 9A through 9C are diagrams of a method of generating a layout of an integrated circuit, according to another embodiment of inventive concepts.
Figure 9B:
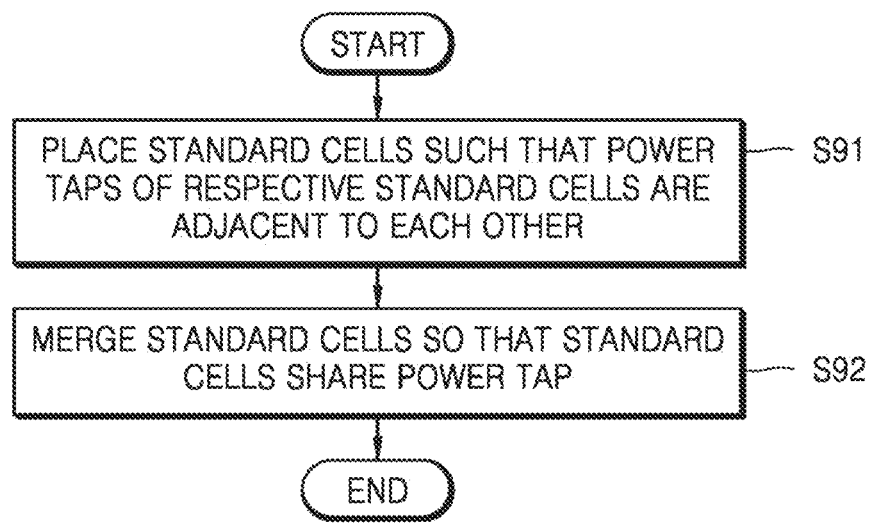
Figure 9C:
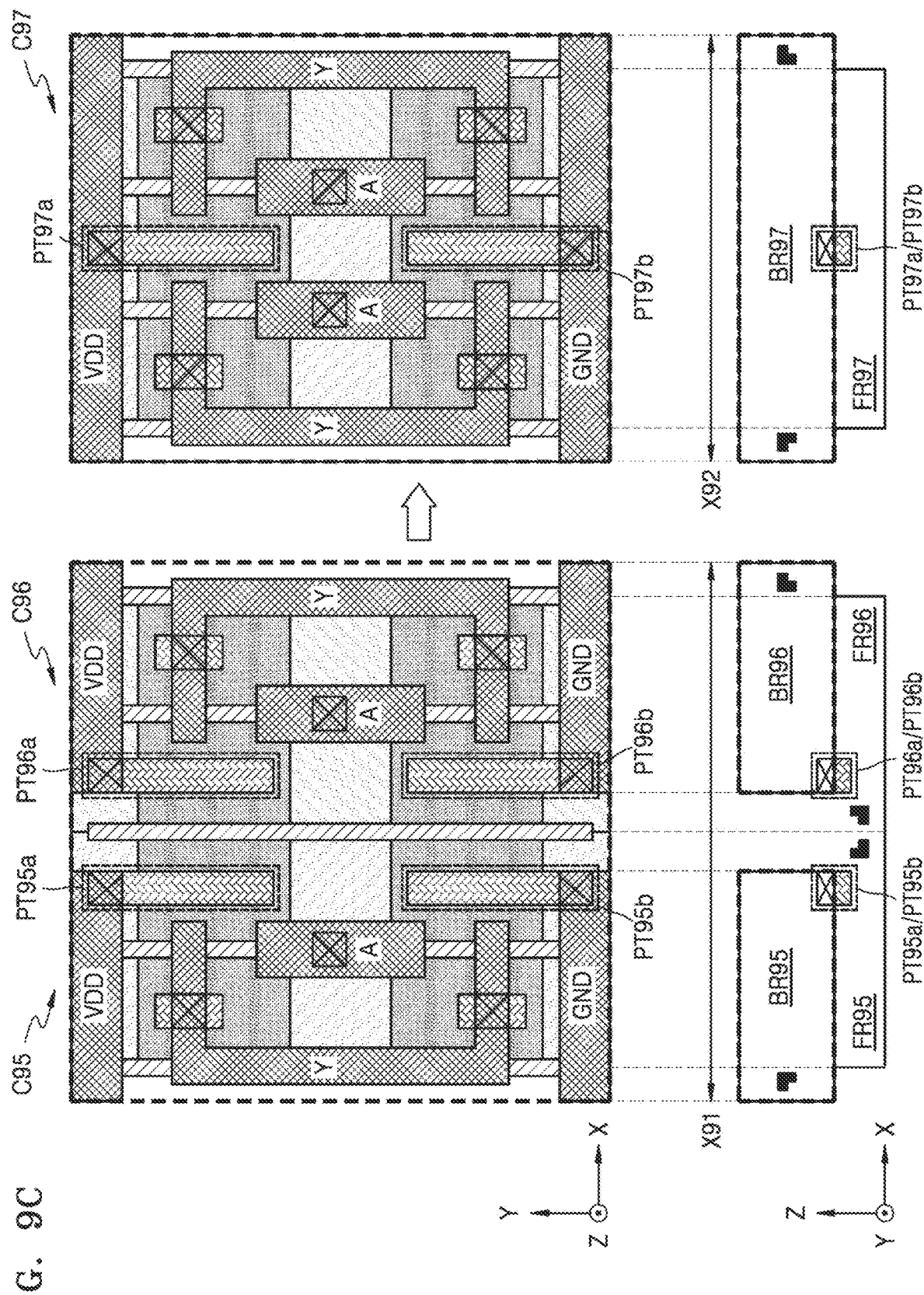

FIG. 9A is a diagram of examples of standard cells including a power tap at one side thereof, the standard cells being defined in a standard cell library, according to an example embodiment of inventive concepts. FIG. 9B is a flowchart of a method of generating a layout of an integrated circuit including a structure in which standard cells merge with each other, the standard cells having different orientations and being placed adjacent to each other, according to an example embodiment of inventive concepts. FIG. 9C is a diagram of an example of the layout generated using the method illustrated in FIG. 9B. According to some embodiments of inventive concepts, standard cells having different orientations may be placed adjacent to each other, and portions of the standard cells may merge with each other, so that spatial efficiency may be increased. The increased spatial efficiency may reduce chip size, which may increase the number of available integrated circuits produced on a given substrate. The increased spatial efficiency may increase a manufacturing yield of the integrated circuit. The increased spatial efficiency may reduce a unit cost of manufacturing the integrated circuit.

Referring to FIG. 9A, the standard cell library may define standard cells having a power tap at one side thereof. For example, as shown in FIG. 9A, first through fourth standard cells C91 through C94 may have the +X orientation and may respectively include pairs of power taps PT91a and PT91b, PT92a and PT92b, PT93a and PT93b, and PT94a and PT94b adjacent to a step section. A power tap may refer to a pattern which provides a path for supplying a power supply voltage to a standard cell. For example, a power tap may include a contact structure connected to a source of a transistor included in a standard cell and may transmit a positive supply voltage or a negative supply voltage to the transistor. The first through fourth standard cells C91 through C94 may include contact structures and vias in proximity to a step section, the contact structures and the vias transmitting a positive supply voltage and a negative supply voltage to transistors. Although standard cells having the +X orientation are illustrated in FIG. 9A, the standard cell library may define standard cells which have the −X orientation and include a power tap adjacent to a step section, for example, standard cells symmetrical with the first through fourth standard cells C91 through C94 with respect to an axis parallel with the Y-axis. Although each of the power taps PT91a, PT91b, PT92a, PT92b, PT93a, PT93b, PT94a, and PT94b is placed in a standard cell to be adjacent to a step section of the standard cell in FIG. 9A, the step section may include at least part of the power tap in other embodiments. As described below, when adjacent standard cells merge with each other, a power tap may be shared between the standard cells, and an area of the standard cells may be decreased. Accordingly, in some embodiments of inventive concepts, standard cells having an orientation may be designed to have a power tap at one side thereof. This will be described in detail with reference to FIGS. 17A and 17B below.

Referring to FIG. 9B, standard cells may be placed such that power taps of the respective standard cells are adjacent to each other in operation S91. For example, as shown in the left of FIG. 9C, a fifth standard cell C95 and a sixth standard cell C96 having different orientations may be placed adjacent to each other. The fifth standard cell C95 may include power taps PT95a and PT95b adjacent to a step section thereof and the sixth standard cell C96 may include power taps PT96a and PT96b adjacent to a step section thereof. While an FEOL region FR95 of the fifth standard cell C95 is in contact with an FEOL region FR96 of the sixth standard cell C96, a space may be formed between a BEOL region BR95 of the fifth standard cell C95 and a BEOL region BR96 of the sixth standard cell C96.

Referring back to FIG. 9B, the standard cells may be merged with each other such that the standard cells share a power tap with each other in operation S92. For example, as shown in the right of FIG. 9C, the fifth and sixth standard cells C95 and C96 are merged to share power taps PT97a and PT97b, so that a seventh standard cell C97 is generated. Accordingly, an X-axis direction length X92 of the seventh standard cell C97 may be less than an X-axis direction length X91 occupied by the fifth and sixth standard cells C95 and C96 placed adjacent to each other. As a result, the spatial efficiency of an integrated circuit may be increased. The increased spatial efficiency may reduce chip size, which may increase the number of available integrated circuits produced on a given substrate. The increased spatial efficiency may increase a manufacturing yield of the integrated circuit. The increased spatial efficiency may reduce a unit cost of manufacturing the integrated circuit. Standard cell merging shown in FIG. 9C may be performed after the placement (for example, during P&R) of the fifth and sixth standard cells C95 and C96 or may be performed on the layout (for example, during design polishing) of the integrated circuit after routing is completed. For example, operation S92 shown in FIG. 9B may be included in operation S420 or S430 shown in FIG. 4.

Figure 10A:
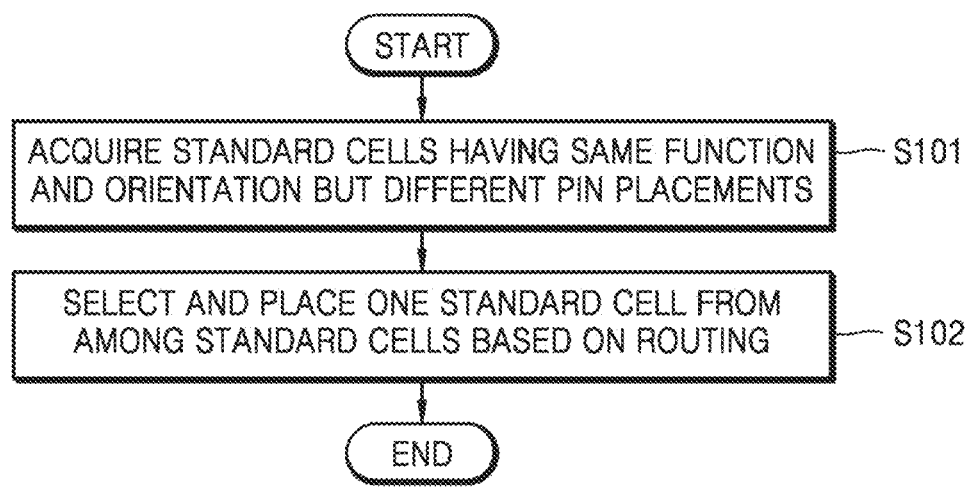
FIGS. 10A and 10B are diagrams of a method of generating a layout of an integrated circuit, according to a further embodiment of inventive concepts.
Figure 10B:
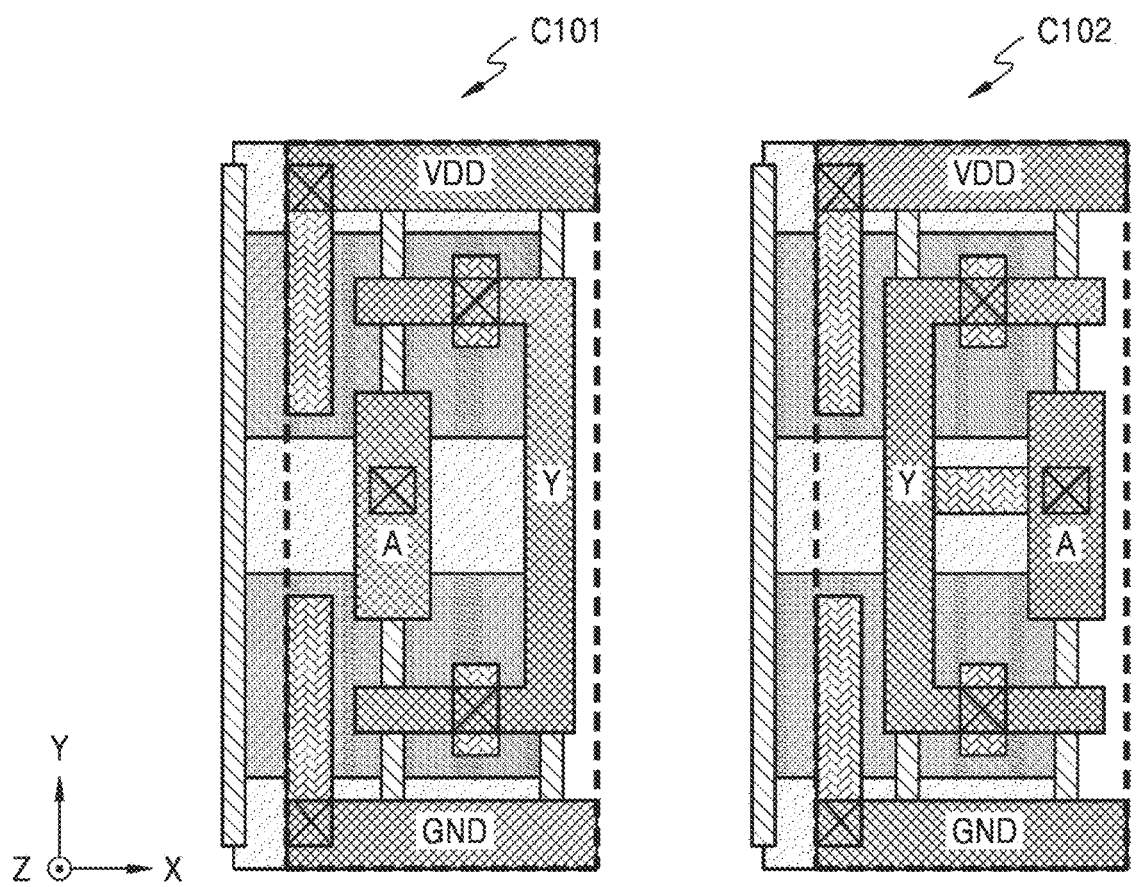

FIG. 10A is a flowchart of a method of generating a layout of an integrated circuit, in which standard cells having different pin placements are selectively placed, according to an example embodiment of inventive concepts. FIG. 10B is a diagram of examples of standard cells having different pin placements. As described below, standard cells suitable for routing may be selected from among standard cells having different pin placements and placed in an integrated circuit, according to some embodiments of inventive concepts. Operations S101 and S102 shown in FIG. 10A may be included in operation S420 shown in FIG. 4.

Referring to FIG. 10A, standard cells having the same function and orientation but different pin placements may be acquired in operation S101. For example, as shown in FIG. 10B, while a first standard cell C101 and a second standard cell C102 may have the +X orientation as inverters including the input pin A and the output pin Y, the first and second standard cells C101 and C102 may have different placements of the input pin A and the output Y. When standard cells having the same orientation are consecutively placed, routing congestion may occur due to the positions of input and output pins of the standard cells. Accordingly, a standard cell library may define standard cells which have the same function and orientation but different pin placements, and standard cells having different pin placements may be acquired from the standard cell library. In some example embodiments, the standard cell library may define standard cells of which FEOL regions are symmetrical with respect to an axis parallel with the Y-axis for different pin placements. At this time, pin placements of the standard cells may be symmetrical with respect to an axis parallel with the Y-axis.

Referring back to FIG. 10A, one standard cell may be selected from among the standard cells and placed, based on routing, in operation S102. For example, as shown in FIG. 10B, while the first standard cell C101 may be suitable when an output signal of a standard cell adjacent in the −X direction is applied to the input pin A, the second standard cell C102 is suitable when a standard cell adjacent in the −X direction receives an output signal output through the output pin Y. As a result, routing congestion may be decreased, the amount of time taken to generate the layout of an integrated circuit may also be decreased, and performance of the integrated circuit may be increased due to a simple routing architecture.

Figure 11A:
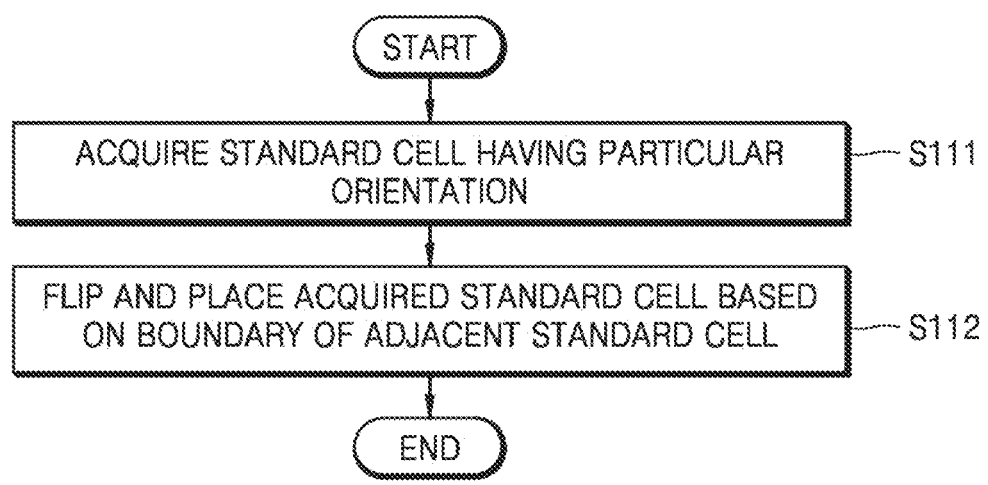
FIGS. 11A and 11B are diagrams of a method of generating a layout of an integrated circuit, according to yet another embodiment of inventive concepts.
Figure 11B:
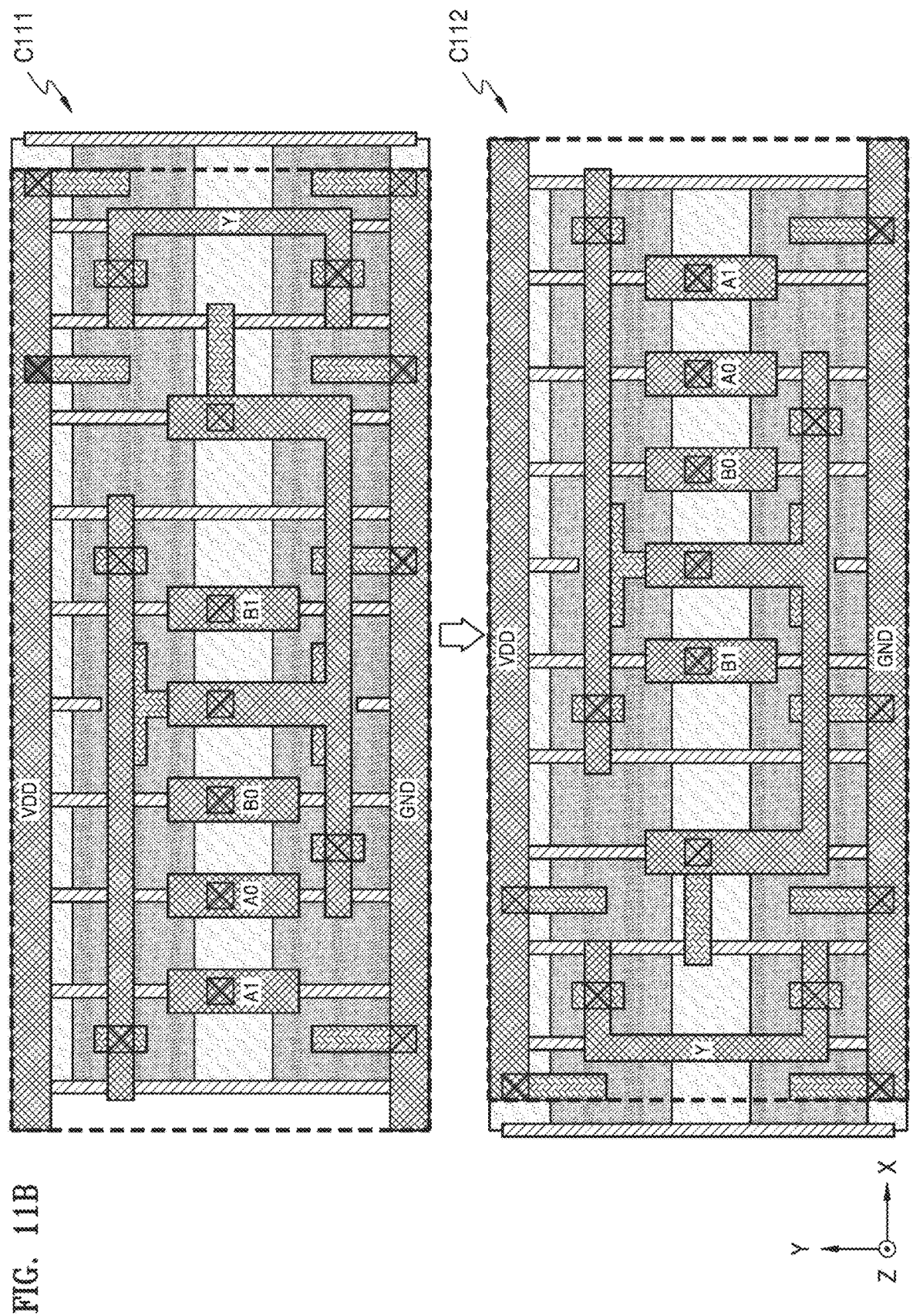

FIG. 11A is a flowchart of a method of generating a layout of an integrated circuit by modifying standard cells, according to an example embodiment of inventive concepts. FIG. 11B is a diagram of an example of the layout generated using the method illustrated in FIG. 11A. As described below, the orientation of a standard cell may be changed during P&R, according to some embodiments of inventive concepts.

Referring to FIG. 11A, a standard cell having a particular orientation may be acquired in operation S111. In some example embodiments, a standard cell library may define a standard cell having the same function as a previously defined standard cell but a different orientation than the defined standard cell. For example, as shown in FIG. 11B, the standard cell library may define a first standard cell C111 having the −X direction as an A0122 which includes input pins A0, A1, B0, and B1 and the output pin Y.

Referring back to FIG. 11A, the acquired standard cell is flipped and placed based on the boundary of a standard cell which the acquired standard cell will be placed adjacent to, in operation S112. For example, when an adjacent standard cell placed on the right or left of the first standard cell C111 has the +X orientation in FIG. 11B, a space may be generated, similarly to the embodiments described above with reference to FIGS. 2C and 2D. In this case, when the first standard cell C111 is flipped during P&R (e.g., operation S420 in FIG. 4), a second standard cell C112 symmetrical with the first standard cell C111 with respect to an axis parallel with the Y-axis may be generated, and the second standard cell C112 may be placed adjacent to the standard cell having the +X orientation. When a standard cell library defining only standard cells having one orientation, unlike the standard cell library D42 shown in FIG. 4, is used, an operation of flipping and placing a standard cell according to the orientation of the standard cell may be performed during P&R.

Figure 12:
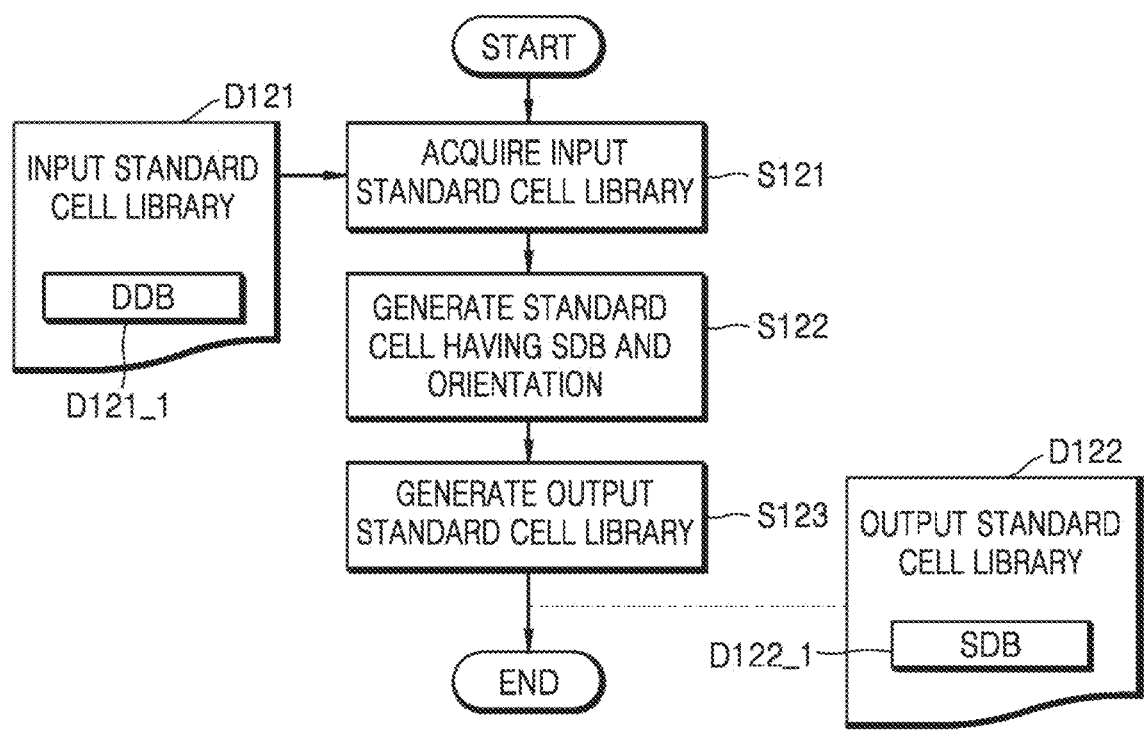
FIG. 12 is a flowchart of a method of generating a standard cell library including a standard cell having an orientation, according to an example embodiment of inventive concepts.

FIG. 12 is a flowchart of a method of generating a standard cell library including a standard cell having an orientation, according to an example embodiment of inventive concepts. As described above with reference to FIG. 1, since a DDB resolves some issues with semiconductor processes, standard cells supporting a DDB may be developed at the initial operational stage of semiconductor processes. As the issues with semiconductor processes become resolved thereafter, standard cells supporting an SDB may be developed. As described below, when standard cells supporting an SDB have an orientation, the standard cells supporting an SDB may be more easily generated from standard cells supporting a DDB. In some embodiments, the method illustrated in FIG. 12 may be performed by a computing system (e.g., 200 in FIG. 20) including a processor and memory.

An input standard cell library D121 may be acquired in operation S121. The input standard cell library D121 may include information D121_1 about standard cells supporting a DDB. The input standard cell library D121 may be non-transiently stored in a computer-readable storage medium and/or may be received through a communication channel.

A standard cell having an SDB and an orientation may be generated in operation S122. As described above with reference to FIG. 1, since a standard cell having an orientation may have the same patterns of a BEOL region as a standard cell supporting a DDB, the standard cell having an orientation may be more easily generated. Operation S122 will be described in detail with reference to FIGS. 13A through 17B below.

An output standard cell library D122 may be generated in operation S123. The output standard cell library D122 may include information D122_1 about standard cells supporting an SDB. The output standard cell library D122 may be used to generate a layout of an integrated circuit, as described above with reference to FIG. 4, and/or may be used to verify an integrated circuit, as described with reference to FIG. 18 below.

Figure 13A:
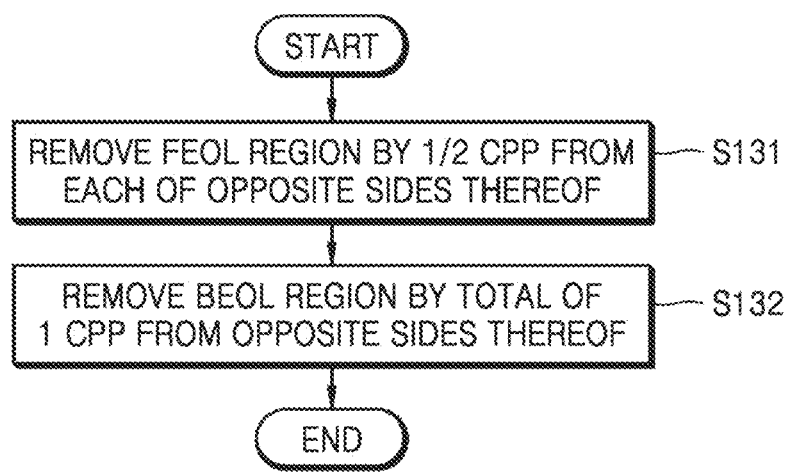
FIGS. 13A and 13B are diagrams of a method of generating a standard cell having an orientation, according to an example embodiment of inventive concepts.
Figure 13B:
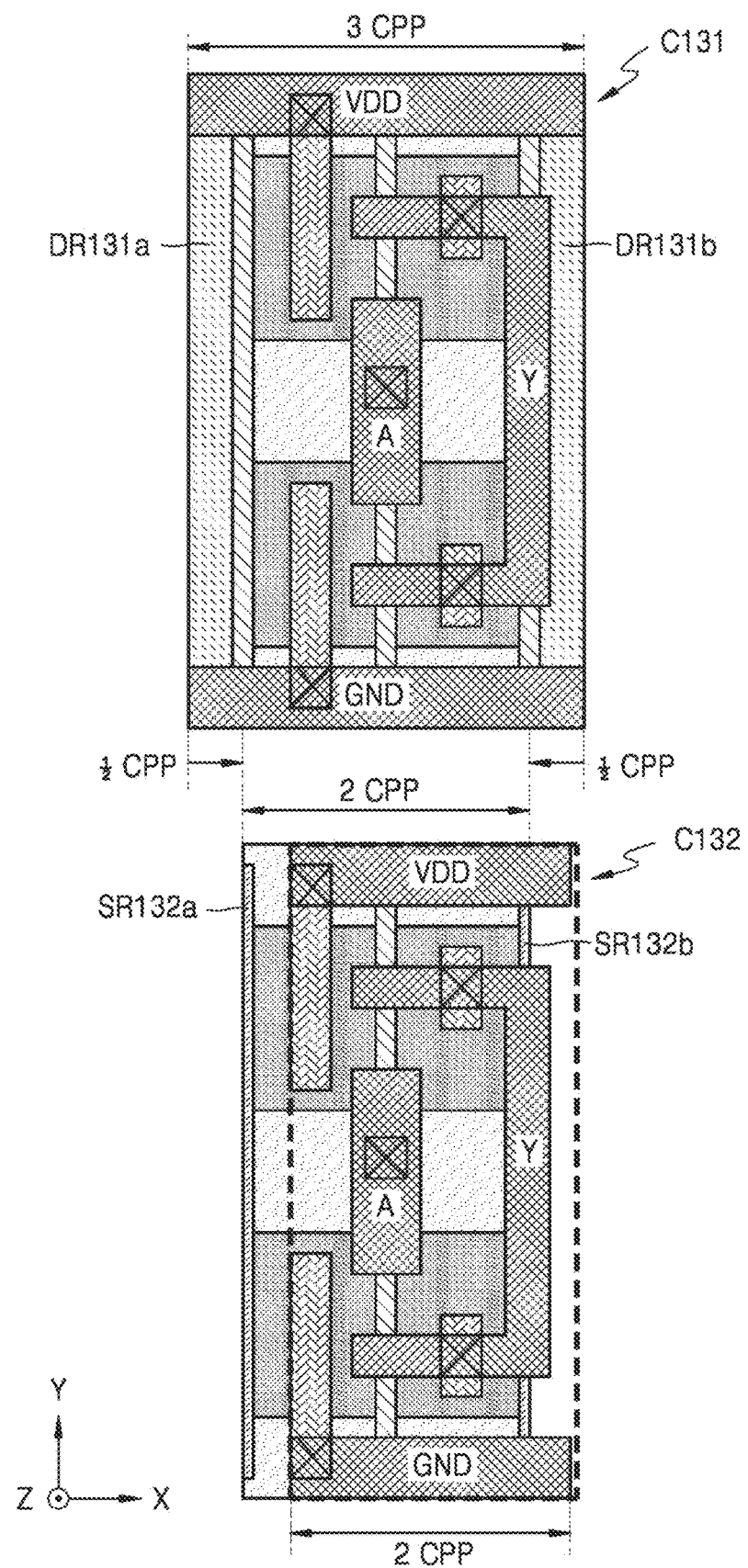

FIG. 13A is a flowchart of a method of generating a standard cell having an orientation, according to an example embodiment of inventive concepts. FIG. 13B is a diagram of an example of the standard cell generated using the method illustrated in FIG. 13A. Operations S131 and S132 shown in FIG. 13A may be included in operation S122 shown in FIG. 12.

Referring to FIG. 13A, an FEOL region of a standard cell may be removed by ½ CPP from each of opposite sides thereof in operation S131. For example, as shown in FIG. 13B, a first standard cell C131 supporting a DDB may include, at opposite sides thereof, DDB regions DR131a and DR131b for the DDB. Since each of the DDB regions DR131a and DR131b may have a width (e.g., an X-axis direction length) of ½ CPP at a side of the first standard cell C131, the DDB regions DR131a and DR131b of the first standard cell C131 may be removed when an FEOL region of the first standard cell C131 is removed by ½ CPP from each of the opposite sides thereof. Accordingly, while the FEOL region of the first standard cell C131 may have an X-axis direction length of 3 CPP, an FEOL region of a second standard cell C132 may have an X-axis direction length of 2 CPP.

Referring back to FIG. 13A, a BEOL region of the standard cell may be removed by a total of 1 CPP from opposite sides thereof in operation S132. For example, as shown in FIG. 13B, after the DDB regions DR131a and DR131b are removed from the first standard cell C131, the output pin Y in a BEOL region of the first standard cell C131 may protrude in the +X direction. When the BEOL region of the first standard cell C131 is removed by a total of 1 CPP from opposite sides thereof without removing the output pin Y protruding the +X direction, the second standard cell C132 having the +X orientation may be generated. Accordingly, the second standard cell C132 may have an X-axis direction length of 2 CPP and may include the BEOL region shifted from the FEOL region in the +X direction. As shown in FIG. 13B, SDB regions SR132a and SR132b extending in the Y-axis direction may be respectively added at the opposite sides of the FEOL region of the second standard cell C132.

Figure 14:
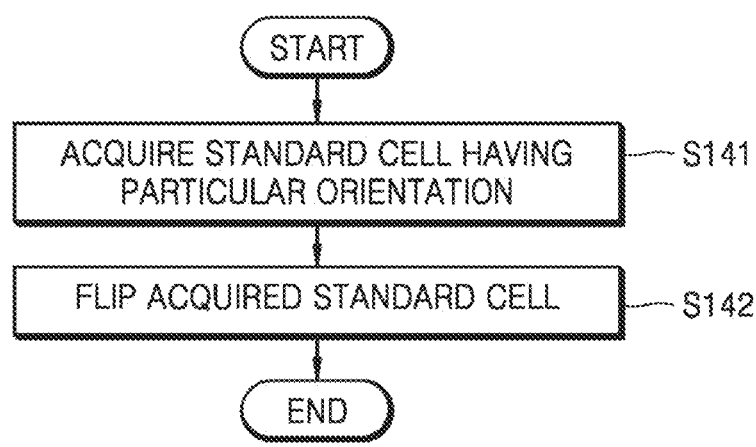
FIG. 14 is a flowchart of a method of generating a standard cell having an orientation, according to another embodiment of inventive concepts.

FIG. 14 is a flowchart of a method of generating a standard cell having an orientation, according to an embodiment of inventive concepts. A standard cell having a different orientation may be generated from a standard cell having a particular orientation.

A standard cell having a particular orientation may be acquired in operation S141. For example, a standard cell (e.g., C132 in FIG. 13B) having the +X orientation may be generated using the method illustrated in FIG. 13B, and standard cells having the +X orientation may be acquired.

The acquired standard cell may be flipped in operation S142. For example, when the second standard cell C132 having the +X orientation, as shown in FIG. 13B, is acquired, a standard cell having the same function as the second standard cell C132 but the −X orientation may be generated by flipping the second standard cell C132 over an axis parallel with the Y-axis.

Figure 15A:
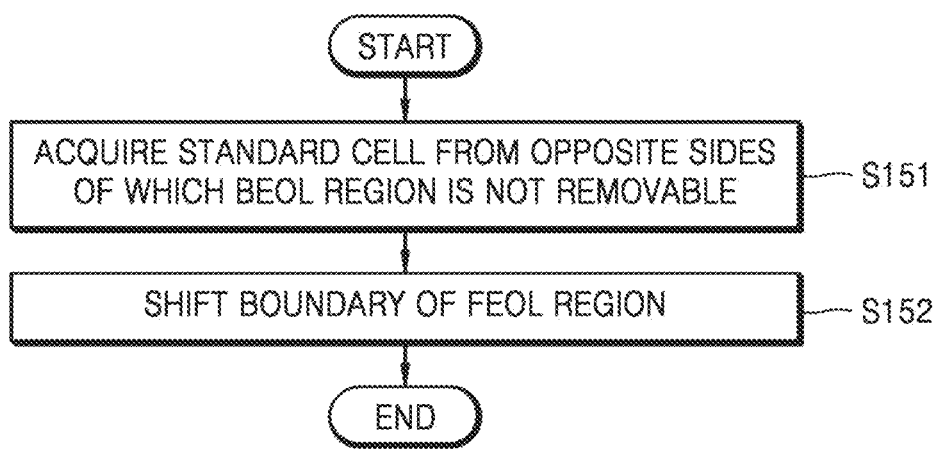
FIGS. 15A and 15B are diagrams of a method of generating a standard cell having an orientation, according to still another embodiment of inventive concepts.
Figure 15B:
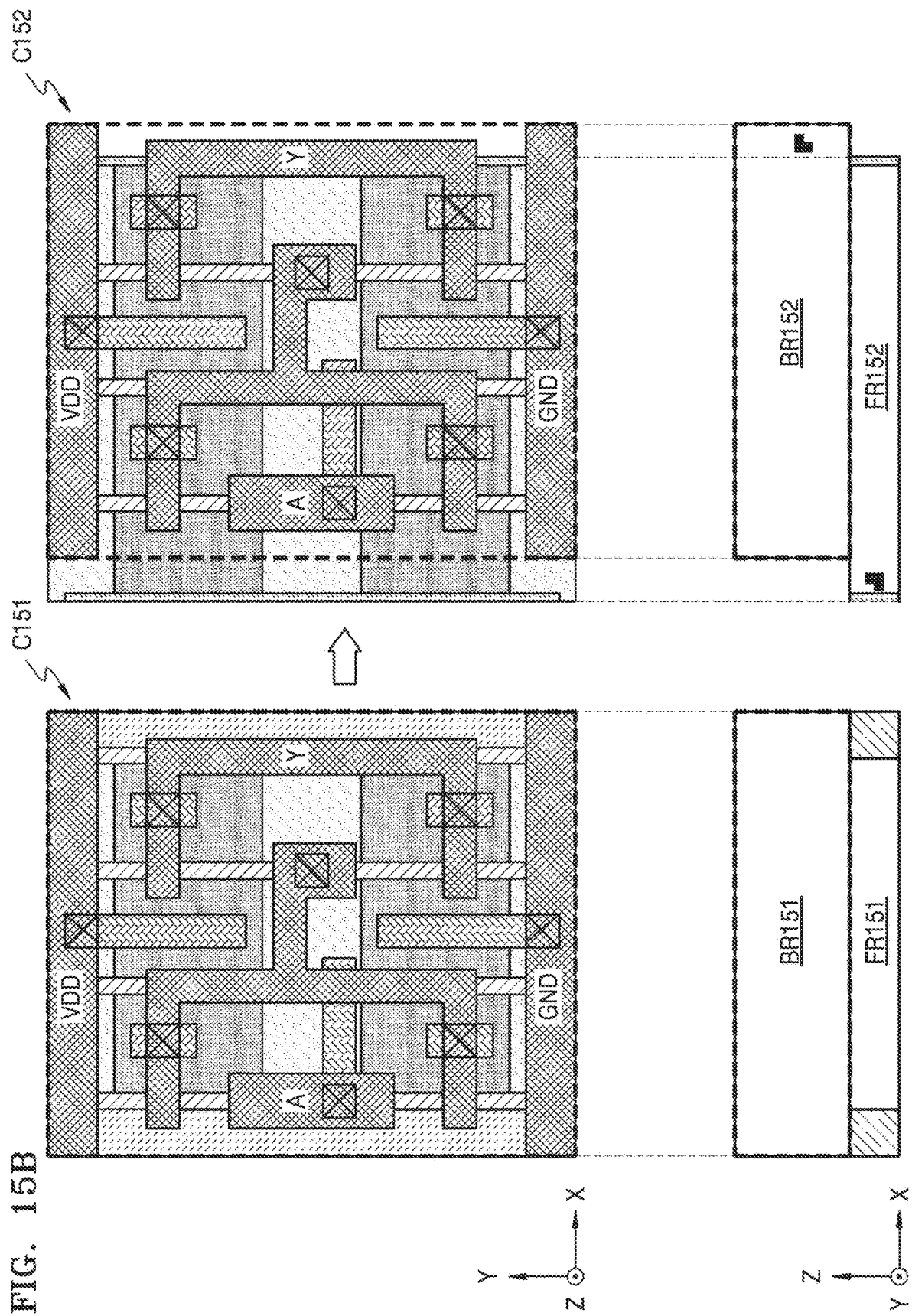

FIG. 15A is a flowchart of a method of generating a standard cell having an orientation, according to still an example embodiment of inventive concepts. FIG. 15B is a diagram of an example of a standard cell generated using the method illustrated in FIG. 15A. Operations S151 and S152 shown in FIG. 15A may be included in operation S122 shown in FIG. 12.

Referring to FIG. 15A, a standard cell from opposite sides of which a BEOL region is not removable may be acquired in operation S151. For example, as shown in FIG. 15B, an FEOL region FR151 of a first standard cell C151 may be removed by ½ CPP from each of opposite sides thereof by removing DDB regions, but a BEOL region BR151 of the first standard cell C151 cannot be removed by a total of 1 CPP from opposite sides thereof due to the input pin A and the output pin Y.

Referring back to FIG. 15A, the boundary of an FEOL region of the standard cell is shifted in operation S152. For example, as shown in FIG. 15B, the boundary of the FEOL region FR151 of the first standard cell C151 may be shifted by ½ CPP in the −X direction, and therefore, a second standard cell C152 may have an FEOL region FR152 having the same X-axis direction length as the FEOL region FR151 of the first standard cell C151 and extending from a gate line in the X-axis direction. As a result, a BEOL region BR152 of the second standard cell C152 may include an eaves section (⌐) protruding in the +X direction and the FEOL region FR152 of the second standard cell C152 may include a step section (⌐) protruding in the −X direction. As well as the FEOL region FR151 of the first standard cell C151, the BEOL region BR151 may also be shifted. As shown in FIG. 15B, the second standard cell C152 may include the BEOL region BR152 resulting from shifting the BEOL region BR151 of the first standard cell C151 in the −X direction.

Figure 16A:
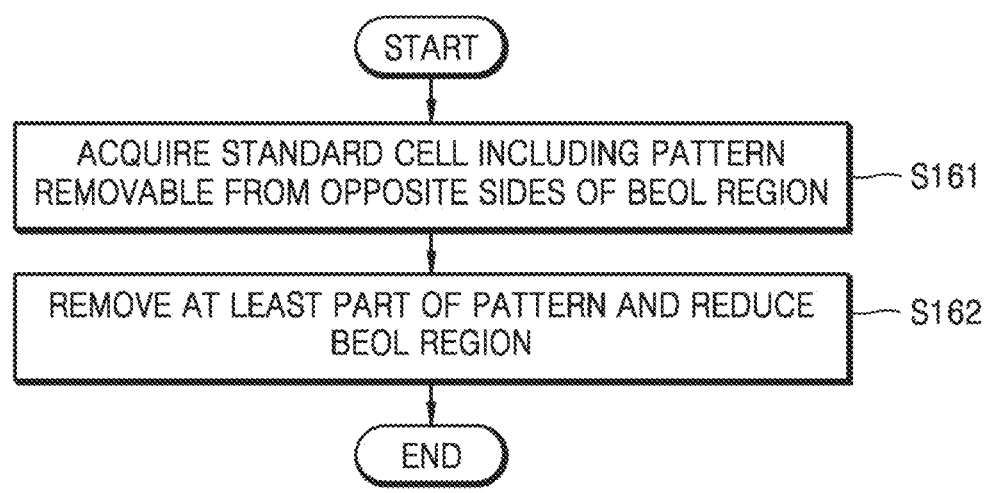
FIGS. 16A and 16B are diagrams of a method of generating a standard cell having an orientation, according to yet another embodiment of inventive concepts.
Figure 16B:
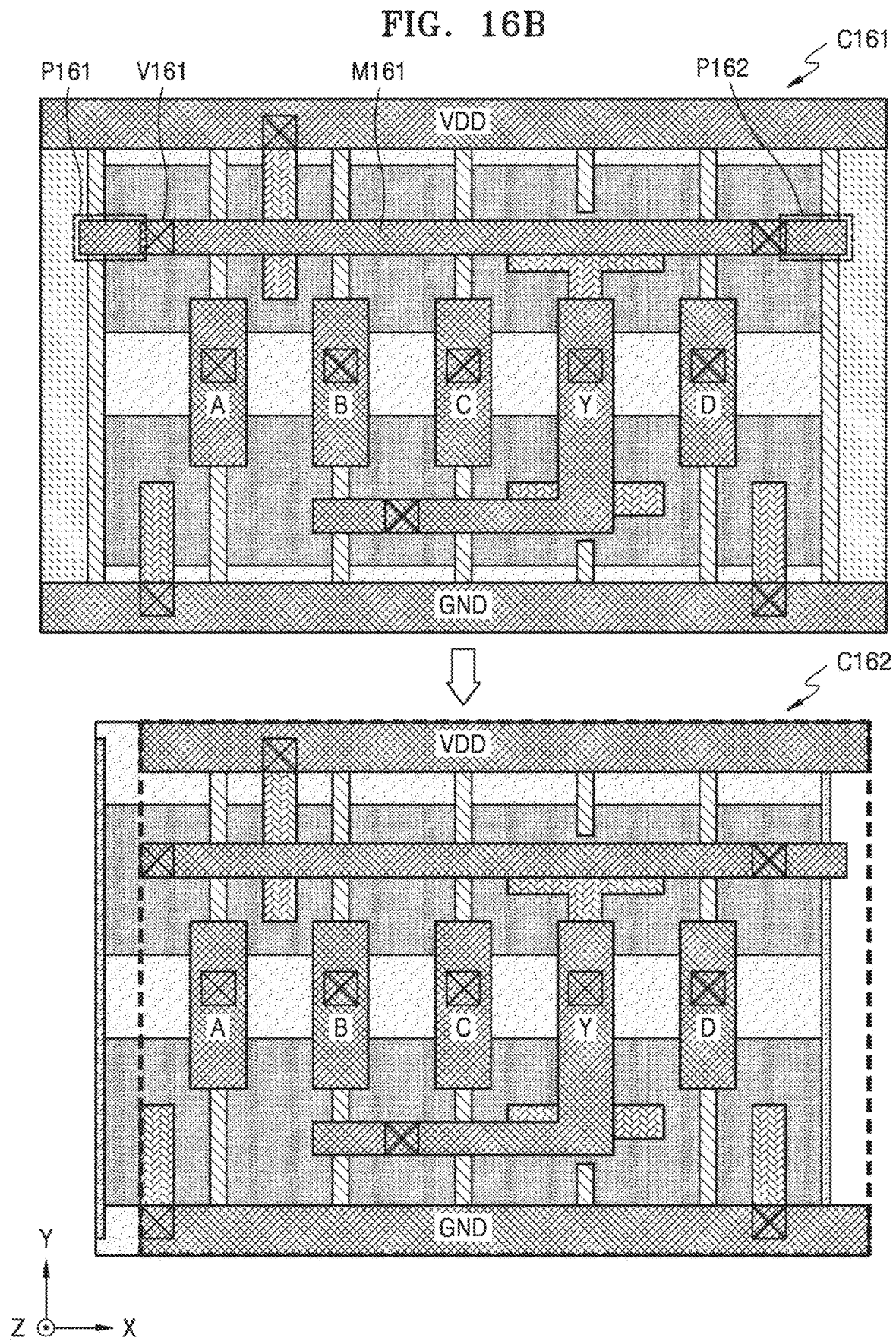

FIG. 16A is a flowchart of a method of generating a standard cell having an orientation, according to yet another embodiment of inventive concepts. FIG. 16B is a diagram of an example of a standard cell generated using the method illustrated in FIG. 16A. Operations S161 and S162 shown in FIG. 16A may be included in operation S122 shown in FIG. 12.

Referring to FIG. 16A, a standard cell including a pattern removable from opposite sides of a BEOL region may be acquired in operation S161. For example, as shown in FIG. 16B, a metal layer pattern M161 of a first standard cell C161 may include a portion P161 extending from a via V161 in the −X direction. The portion P161 of the metal layer pattern M161 is not electrically connected to other patterns than the via V161 electrically connecting the metal layer pattern M161 with a contact structure and may thus be removable. Similarly, a portion P162 of the metal layer pattern M161 may also be removable.

Referring back to FIG. 16A, at least part of the pattern may be removed and the BEOL region may be reduced in operation S162. For example, as in a second standard cell C162 shown in FIG. 16B, the portion P161 of the metal layer pattern M161 of the first standard cell C161 may be removed, and therefore, the second standard cell C162 may include a BEOL region having a shorter X-axis direction length than that of the first standard cell C161. Accordingly, similarly to the embodiment described above with reference to FIGS. 13A and 13B, an FEOL region of the second standard cell C162 may be generated by removing DDB regions from the first standard cell C161, and consequently, the second standard cell C162 may have the +X orientation.

Figure 17A:
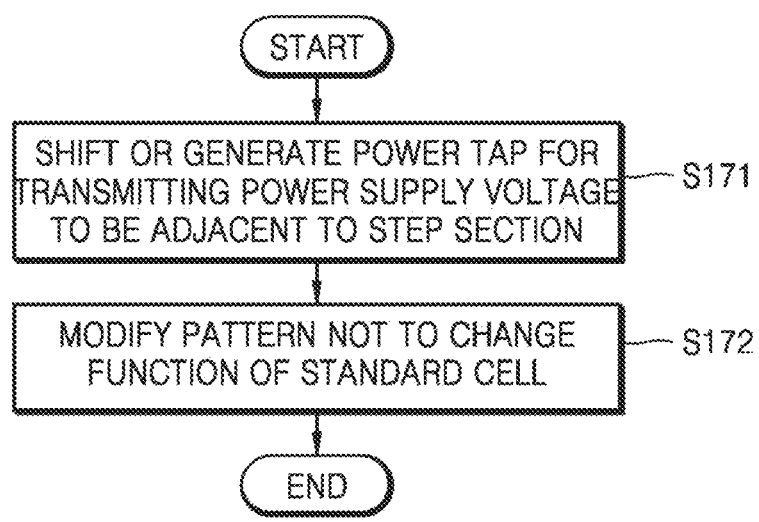
FIGS. 17A and 17B are diagrams of a method of generating a standard cell having an orientation, according to a further embodiment of inventive concepts.
Figure 17B:
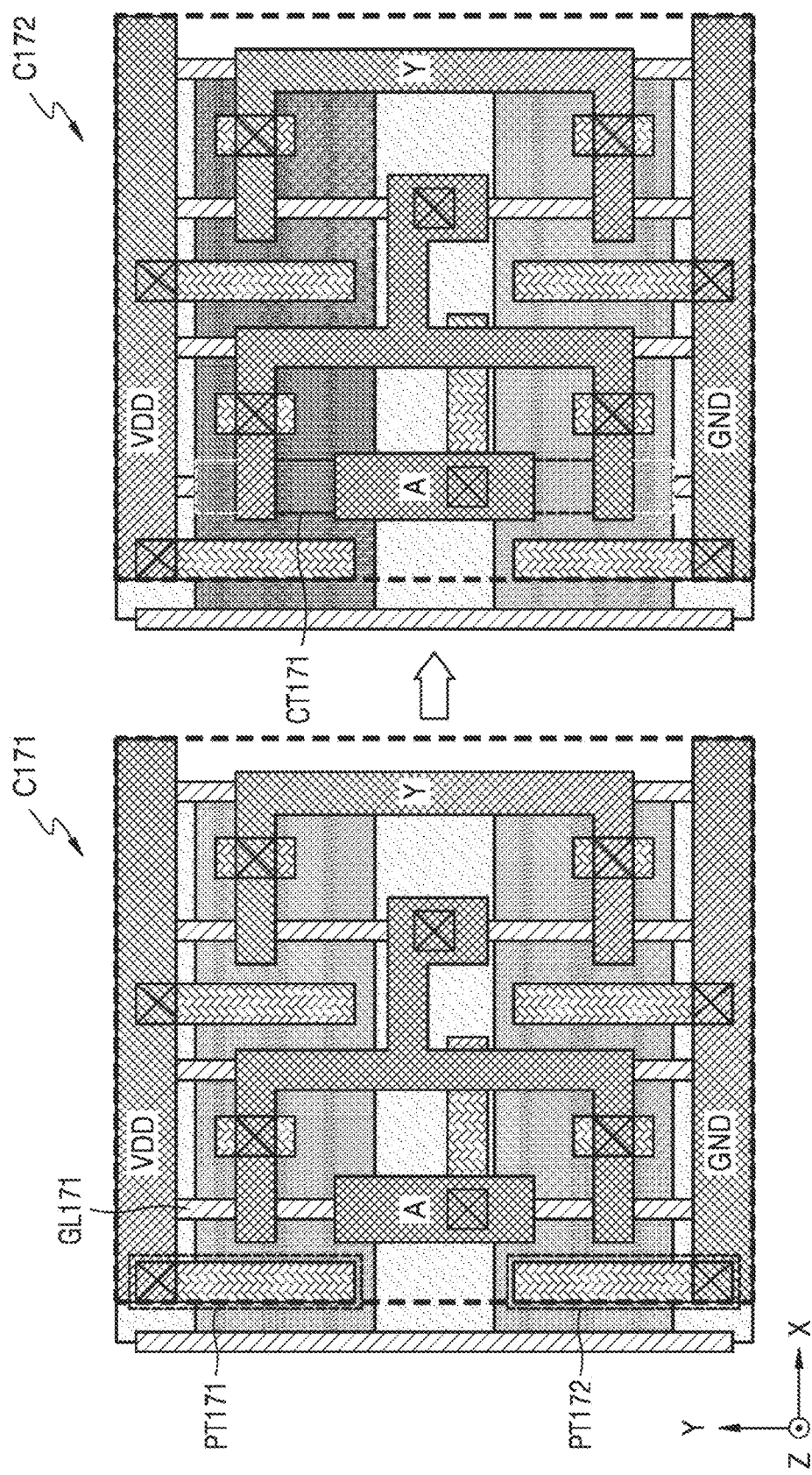

FIG. 17A is a flowchart of a method of generating a standard cell having an orientation, according to an example embodiment of inventive concepts. FIG. 17B is a diagram of an example of a standard cell generated using the method illustrated in FIG. 17A. Operations S171 and S172 shown in FIG. 17A may be included in operation S122 shown in FIG. 12.

Referring to FIG. 17A, a power tap for transmitting a power supply voltage may be shifted or generated to be adjacent to a step section in operation S171. As described above with reference to FIG. 15B, the second standard cell C152 shown in FIG. 15B may be generated by shifting the boundary of the FEOL region FR151 of the first standard cell C151. At this time, a power tap may be placed adjacent to a portion protruding due to the shift of the FEOL region FR151, e.g., the step section (⌐) of the FEOL region FR152, or the power tap may be placed such that at least part of the power tap is included in the step section (⌐). For example, as shown in FIG. 17B, when power taps PT171 and PT172 are generated to be adjacent to the step section (⌐) of the second standard cell C152 shown in FIG. 15B, a first standard cell C171 shown in FIG. 17B may be generated.

Referring back to FIG. 17A, a pattern may be modified not to change the function of a standard cell in operation S172. For example, the input pin A electrically connected to a gate line GL171 may be influenced by the power taps PT171 and PT172 in the first standard cell C171 shown in FIG. 17B. For this reason, a gate cut CT171 removing the gate line GL171 may be generated, as in a second standard cell C172. Accordingly, as described above with reference to FIGS. 9A through 9C, the second standard cell C172 may have a structure allowing the second standard cell C172 to share a power tap with an adjacent standard cell, thereby contributing to an increase in spatial efficiency of an integrated circuit. The increased spatial efficiency may reduce chip size, which may increase the number of available integrated circuits produced on a given substrate. The increased spatial efficiency may increase a manufacturing yield of the integrated circuit. The increased spatial efficiency may reduce a unit cost of manufacturing the integrated circuit.

Figure 18:
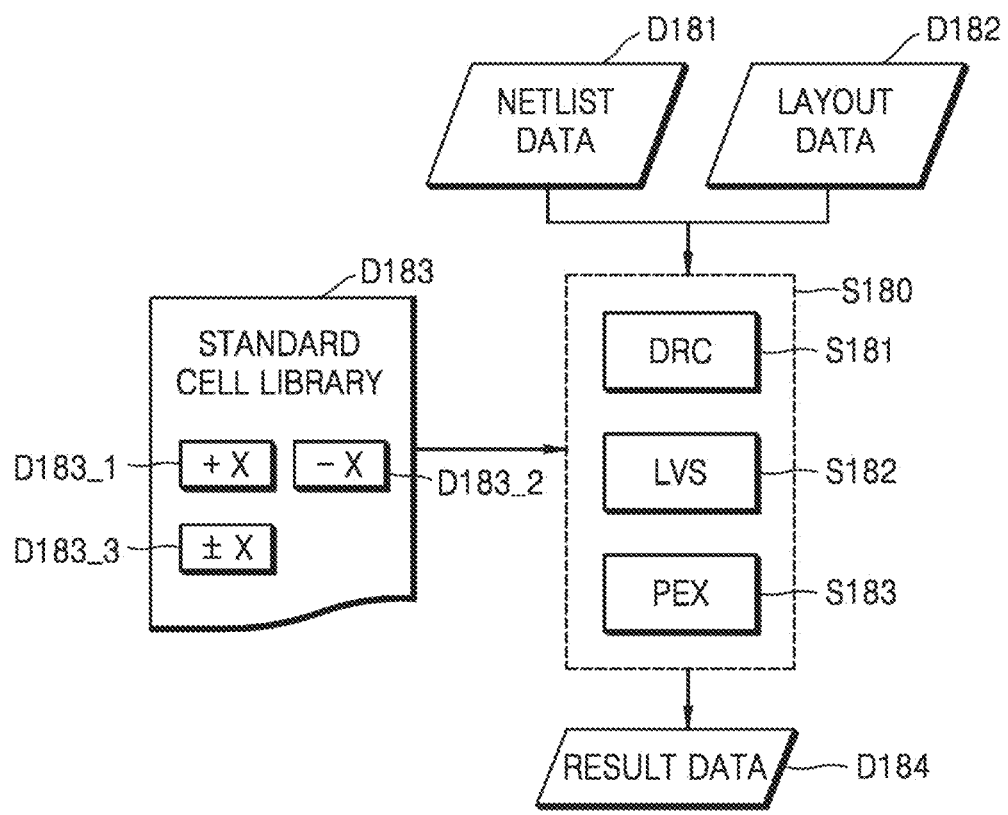
FIG. 18 is a diagram of a method of verifying an integrated circuit including standard cells having an orientation, according to an example embodiment of inventive concepts.

FIG. 18 is a diagram of a method S180 of verifying an integrated circuit including standard cells having an orientation, according to an example embodiment of inventive concepts. The method S180 shown in FIG. 18 may be performed by a computing system (e.g., 200 in FIG. 20) including a processor and memory.

The method S180 may include a plurality of operations S181 through S183 and may generate result data D184 from netlist data D181 and layout data D182, referring to a standard cell library D183. As described above with reference to FIG. 4, the netlist data D181 may include a netlist describing standard cells and connection relationships among the standard cells in an integrated circuit. The netlist is generated through logic synthesis or the like. The layout data D182 may be generated by placing and routing standard cells based on the netlist data D181, referring to the standard cell library D183. The layout data D182 may represent the layout of an integrated circuit. The standard cell library D183 may include a first group D183_1 including standard cells having the +X orientation, a second group D183_2 including standard cells having the −X orientation, and a third group D183_3 including standard cells having the ±X orientation. Standard cells included in a same functional group may have different characteristics according to orientations. The first through third groups D183_1 through D183_3 may individually define information about characteristics of standard cells.

Design rule check (DRC) may be performed in operation S181. Design rules may be defined based on semiconductor processes, and may define, for example, a minimum width of a pattern and a minimum distance between patterns. Whether the integrated circuit layout defined by the layout data D182 complies with the design rules may be verified, referring to the first through third groups D183_1 through D183_3 included in the standard cell library D183. When a portion not complying with the design rules is detected, the result data D184 including coordinates of the portion, a violated design rule, an error, etc. may be generated. Further optimization may be performed and operation S181 may be iterated, e.g. may be iterated to generate a DRC-clean design, i.e. a design that does not have a portion that does not comply with the design rules.

Layout versus schematic (LVS) may be performed in operation S182. The LVS may refer to an operation of verifying whether an integrated circuit defined by the netlist data D181 agrees with an integrated circuit defined by the layout data D182. For example, whether standard cells and nodes included in the netlist data D181 exist in the layout defined by the layout data D182 may be verified. The LVS may be performed, referring to the first through third groups D183_1 through D183_3 included in the standard cell library D183, and the result data D184 including information about a portion not agreeing between the netlist data D181 and the layout data D182 may be generated. Further optimization may be performed and operation S182 may be iterated, e.g. may be iterated to generate an LV-clean design, i.e. a design that does not have a portion that does not agree between the netlist data D181 and the layout data D182.

Parasitic extraction (PEX) may be performed in operation S183. The PEX may refer to an operation of extracting parasitic components from the layout of an integrated circuit defined by the layout data D182 in order to simulate the performance, e.g., operating speed or power consumption, of the integrated circuit. For example, resistance and capacitance of an interconnection forming a node may be extracted from the layout data D182, and an equivalent circuit of the interconnection including the extracted resistance and capacitance may be generated. Parasitic components may be extracted from the layout data D182, referring to the first through third groups D183_1 through D183_3 included in the standard cell library D183, and the result data D184 including information about the extracted parasitic components may be generated.

Figure 19:
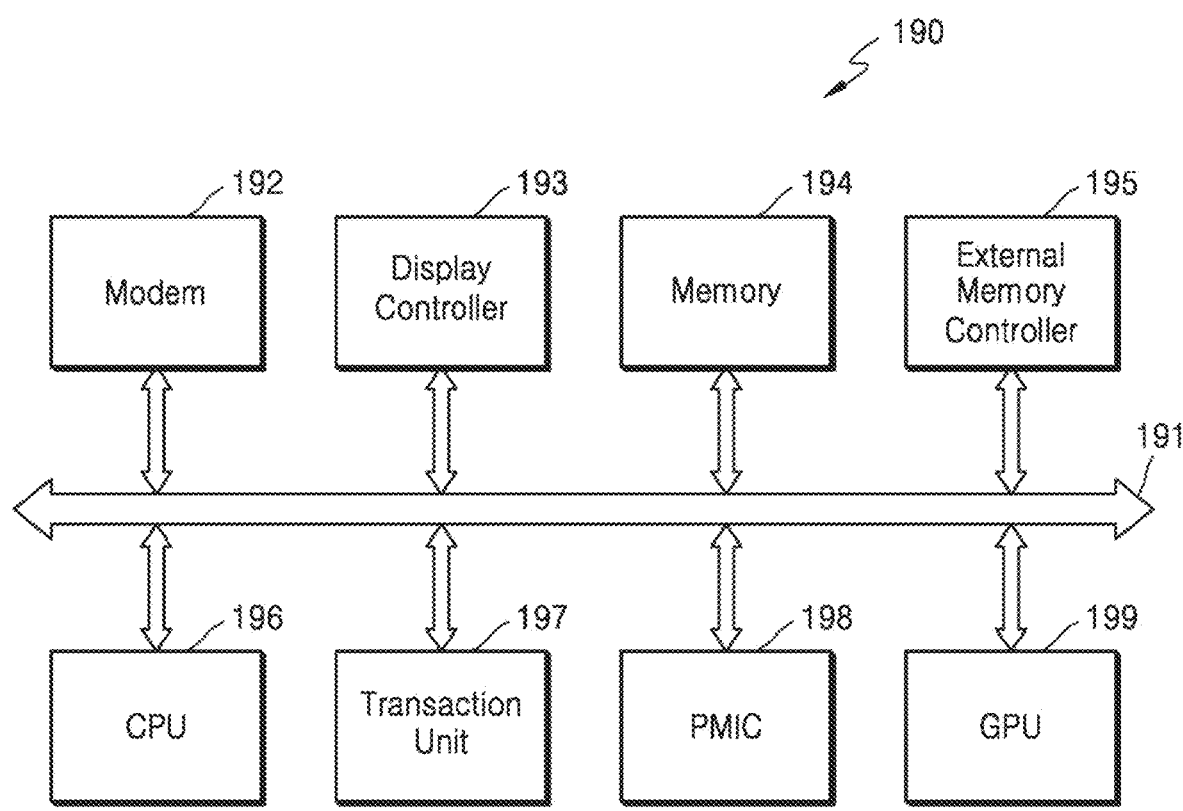
FIG. 19 is a block diagram of a system-on-chip (SoC) according to an example embodiment of inventive concepts.

FIG. 19 is a block diagram of a system-on-chip (SoC) 190 according to some embodiments of inventive concepts. The SoC 190 may be a semiconductor device and may include an integrated circuit according to an example embodiment of inventive concepts. The SoC 190 is implemented by integrating complex functional blocks, such as intellectual properties (IPs) performing various functions, into a single chip. According to an example embodiment of inventive concepts, a standard cell may be included in each of the functional blocks of the SoC 190, and therefore, the SoC 190 may have increased spatial efficiency and verified performance. The increased spatial efficiency may reduce chip size, which may increase the number of available integrated circuits produced on a given substrate. The increased spatial efficiency may increase a manufacturing yield of the integrated circuit. The increased spatial efficiency may reduce a unit cost of manufacturing the integrated circuit.

Referring to FIG. 19, the SoC 190 may include a modem 192, a display controller 193, memory 194, an external memory controller 195, a central processing unit (CPU) 196, a transaction unit 197, a power management integrated circuit (PMIC) 198, and a graphics processing unit (GPU) 199. The functional blocks of the SoC 190 may communicate with one another through a system bus 191.

The CPU 196, which may control all operations of the SoC 190, may control operations of other functional blocks including the modem 192, the display controller 193, the memory 194, the external memory controller 195, the CPU 196, the transaction unit 197, the PMIC 198, and the GPU 199. The modem 192 may demodulate a signal received from outside the SoC 190 or may modulate a signal generated in the SoC 190 and transmit the signal to outside of the SoC 190. The external memory controller 195 may control operations of transmitting and receiving data to and from an external memory device connected to the SoC 190. For example, programs and/or data stored in the external memory device may be provided to the CPU 196 or the GPU 199 under the control of the external memory controller 195. The GPU 199 may execute program instructions involved in graphics processing. The GPU 199 may receive graphic data through the external memory controller 195 and may transmit processed graphic data to outside of the SoC 190 through the external memory controller 195. The transaction unit 197 may monitor a data transaction of each functional block. The PMIC 198 may control power supplied to each functional block according to the control of the transaction unit 197. The display controller 193 may control a display (or a display device) outside the SoC 190 and transmit data generated in the SoC 190 to the display.

The memory 194 may be or may include non-volatile memory, such as electrically erasable programmable read-only memory (EEPROM), flash memory, phase-change random access memory (PRAM or PCRAM), resistance RAM (RRAM), nano floating gate memory (NFGM), polymer RAM (PoRAM), magnetic RAM (MRAM), or ferroelectric RAM (FRAM or FeRAM), and/or may be or may include volatile memory, such as dynamic RAM (DRAM), static RAM (SRAM), mobile DRAM, double data rate (DDR) synchronous DRAM (SDRAM), low power DDR (LPDDR) SDRAM, graphics DDR (GDDR) SDRAM, or Rambus DRAM (RDRAM).

Figure 20:
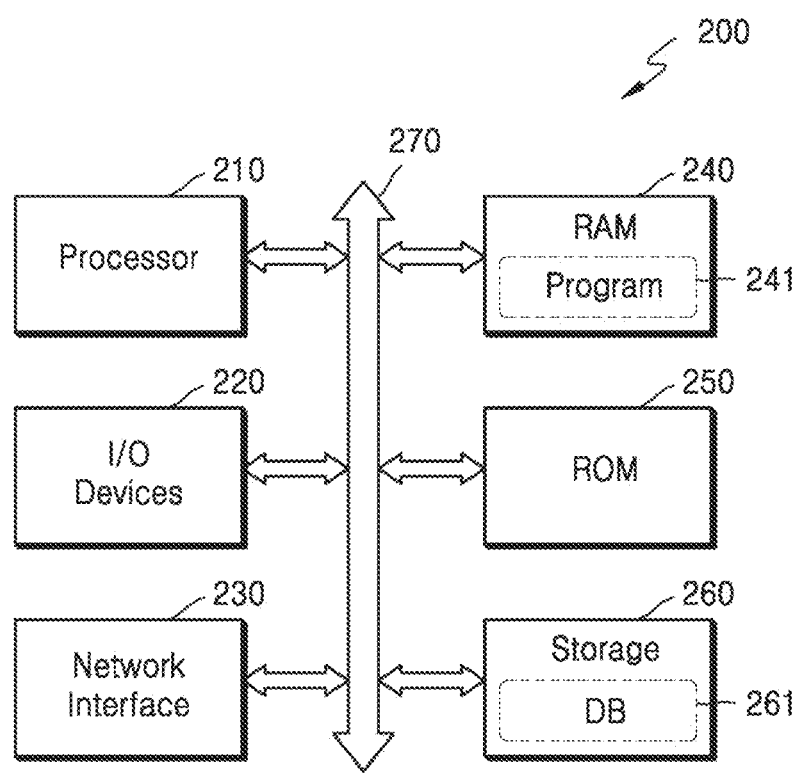
FIG. 20 is a block diagram of a computing system including memory storing a program according to an example embodiment of inventive concepts.

FIG. 20 is a block diagram of a computing system 200 including memory storing a program, according to an example embodiment of inventive concepts. At least some operations among operations included in a method of fabricating an integrated circuit (e.g., the method shown in FIG. 4), operations included in a method of generating a layout of an integrated circuit (e.g., S420 in FIG. 4), and/or operations included in a method of generating a standard cell library (e.g., the method shown in FIG. 12), according to embodiments of inventive concepts, may be performed in the computing system 200.

The computing system 200 may be a stationary computing system such as a desktop computer, a workstation, or a server or may be a portable computing system such as a laptop computer. As shown in FIG. 20, the computing system 200 may include a processor 210, input/output (I/O) devices 220, a network interface 230, RAM 240, ROM 250, and a storage 260. The processor 210, the I/O devices 220, the network interface 230, the RAM 240, the ROM 250, and the storage 260 may be connected to a bus 270 and may communicate with one another through the bus 270.

The processor 210 may be referred to as a processing unit and may include at least one core, which may execute an instruction set (e.g., Intel Architecture-32 (IA-32), 64-bit extension IA-32, x86-64, PowerPC, Sparc, microprocessor without interlocked pipeline stage (MIPS), advanced recued instruction set computer (RISC) machine (ARM), or IA-64), like a microprocessor, an application processor (AP), a digital signal processor (DSP), or a GPU. For example, the processor 210 may access memory, i.e., the RAM 240 or the ROM 250, through the bus 270 and may execute instructions stored in the RAM 240 or the ROM 250.

The RAM 240 may store a program 241 for fabricating an integrated circuit, according to an example embodiment of inventive concepts, or may store at least part of the program 241. The program 241 may enable the processor 210 to perform at least some operations among operations included in a method of fabricating an integrated circuit, operations included in a method of generating a layout of an integrated circuit, and/or operations included in a method of generating a standard cell library (e.g., the method shown in FIG. 12). In other words, the program 241 may include a plurality of instructions which can be executed by the processor 210. The instructions included in the program 241 may enable the processor 210 to perform, for example, at least some operations included in the above-described flowcharts.

The storage 260 may not lose data stored therein even when power supplied to the computing system 200 is cut off. The storage 260 may include a non-volatile memory device or a storage medium such as a magnetic tape, an optical disc, or a magnetic disc. The storage 260 may be removable from the computing system 200. The storage 260 may store the program 241 according to an example embodiment of inventive concepts. Before being executed by the processor 210, the program 241 or at least part of the program 241 may be loaded from the storage 260 to the RAM 240. Alternatively or additionally, the storage 260 may store a file written in program language, and the program 241 generated by a compiler from the file or at least part of the program 241 may be loaded to the RAM 240. The storage 260 may also store a database (DB) 261. The DB 261 may include at least part of information, e.g., the standard cell library D42 shown in FIG. 4, the input standard cell library D121 shown in FIG. 12, and the output standard cell library D122 shown in FIG. 12, required or used to design an integrated circuit.

The storage 260 may also store data to be processed by the processor 210 or data that has been processed by the processor 210. In other words, the processor 210 may generate data by processing data stored in the storage 260 or may store generated data in the storage 260 according to the program 241. For example, the storage 260 may store the RTL data D41, the net list data D43 and/or the layout data D44 show in FIG. 4 or the net list data D181, the layout data D182 and/or the result data D184 show in FIG. 18.

The I/O devices 220 may include an input device such as a keyboard or a pointing device and an output device such as a display device or a printer. For example, a user may trigger the execution of the program 241 by the processor 210, input the RTL data D41 and/or the net list data D43 shown in FIG. 4, and check the layout data D44 shown in FIG. 4, through the I/O devices 220.

The network interface 230 may provide an access to a network outside the computing system 200. For example, the network may include a plurality of computing systems and communication links. The communication links may include wired links, optical links, wireless links, or other types of links.

The various operations of methods described above may be performed by any suitable means capable of performing the operations, such as various hardware and/or software component(s), circuits, and/or module(s).

The software may comprise an ordered listing of executable instructions_for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While inventive concepts have been particularly shown and described with reference to embodiments thereof, it will be understood that various changes in form and details may be made therein without departing from the spirit and scope of the following claims.

What is claimed is:

1. An integrated circuit comprising:
   a first standard cell including a first front-end-of-line (FEOL) region and a first back-end-of-line (BEOL) region, wherein the first FEOL region includes at least one gate line extending in a first horizontal direction and at least one fin extending in a second horizontal direction crossing the first horizontal direction, and the first BEOL region includes a first pattern extending in the first horizontal direction and overlapping a boundary of the first FEOL region in a vertical direction.

2. The integrated circuit of claim 1, wherein the first pattern includes an input pin or an output pin of the first standard cell.

3. The integrated circuit of claim 1, wherein the first BEOL region includes an eaves section protruding in the second horizontal direction and not overlapping the first FEOL region in the vertical direction, and the eaves section includes at least part of the first pattern.

4. The integrated circuit of claim 3, further comprising:
a second standard cell adjacent to the first standard cell in the second horizontal direction,
wherein the second standard cell includes a second FEOL region and a second BEOL region, and
the second FEOL region includes a first step section overlapping the eaves section of the first standard cell in the vertical direction and protruding in direction antiparallel to the second horizontal direction.

5. The integrated circuit of claim 4, further comprising:
a single diffusion break extending in the first horizontal direction between the first FEOL region and the second FEOL region.

6. The integrated circuit of claim 4, wherein the second BEOL region includes an eaves section protruding in the second horizontal direction and not overlapping the second FEOL region of the second standard cell in the vertical direction, and
a length of the eaves section of the second standard cell in the second horizontal direction is the same as a length of the first step section in the second horizontal direction.

7. The integrated circuit of claim 4, wherein the second FEOL region further includes a second step section protruding in the second horizontal direction and not overlapping the second BEOL region in the vertical direction, and
a length of the second step section in the second horizontal direction is the same as a length of the first step section in the second horizontal direction.

8. The integrated circuit of claim 7, further comprising:
a third standard cell adjacent to the second standard cell in the second horizontal direction,
wherein the third standard cell includes a third FEOL region and a third BEOL region, and
the third BEOL region includes an eaves section protruding in a direction antiparallel to the second horizontal direction and overlapping the second step section in the vertical direction.

9. The integrated circuit of claim 3, further comprising:
a second standard cell adjacent to the first standard cell in the second horizontal direction,
wherein the second standard cell includes a second FEOL region and a second BEOL region, and
the second BEOL region includes an eaves section protruding in a direction antiparallel to the second horizontal direction and not overlapping the second FEOL region in the vertical direction.

10. The integrated circuit of claim 9, further comprising:
a double diffusion break extending in the first horizontal direction between the first FEOL region and the second FEOL region, wherein the double diffusion break overlaps the eaves sections of the first and second standard cells in the vertical direction.

11. The integrated circuit of claim 3, wherein the first FEOL region includes a step section protruding in a direction antiparallel to the second horizontal direction and not overlapping the first BEOL region in the vertical direction, and
a length of the step section of the first standard cell in the second horizontal direction is the same as a length of the eaves section of the first standard cell in the second horizontal direction.

12. The integrated circuit of claim 11, further comprising:
a second standard cell adjacent to the first standard cell in direction antiparallel to the second horizontal direction, and
wherein the second standard cell includes a second FEOL region and a second BEOL region, and
the second FEOL region includes a step section protruding in the second horizontal direction and not overlapping the second BEOL region in the vertical direction.

13. The integrated circuit of claim 12, further comprising:
a single diffusion break extending in the first horizontal direction between the first FEOL region and the second FEOL region.

14. The integrated circuit of claim 12, further comprising:
at least one pattern extending in the second horizontal direction between the BEOL region of the first standard cell and the BEOL region of the second standard cell and connecting power lines of the first and second standard cells.

15. The integrated circuit of claim 11, further comprising:
a second standard cell adjacent to the first standard cell in direction antiparallel to the second horizontal direction,
wherein the second standard cell includes a second FEOL region and a second BEOL region,
the second BEOL region comprises a first eaves section and a second eaves section which do not overlap the second FEOL region in the vertical direction,
the first and second eaves sections respectively protrude in the second horizontal direction and the direction antiparallel to the second horizontal direction and have the same length in the second horizontal direction, and
the first eaves section overlaps the step section of the first standard cell in the vertical direction.

16. The integrated circuit of claim 15, further comprising:
a third standard cell adjacent to the second standard cell in direction antiparallel to the second horizontal direction,
wherein the third standard cell includes a third FEOL region and a third BEOL region,
the third FEOL region includes a step section protruding in the second horizontal direction and overlapping the second eaves section in the vertical direction.

17. The integrated circuit of claim 11, wherein the first FEOL region further comprises at least one transistor and at least one contact structure configured to transmit a power supply voltage to the at least one transistor, and
the at least one contact structure is adjacent to the step section of the first standard cell.

18. The integrated circuit of claim 3, further comprising:
a second standard cell symmetrical with the first standard cell with respect to an axis parallel with the first horizontal direction, the second standard cell providing the same function as the first standard cell, and wherein a BEOL region of the second standard cell comprises an eaves section protruding in a direction antiparallel to the second horizontal direction.

19. The integrated circuit of claim 3, further comprising:
a second standard cell including a second FEOL region and a second BEOL region which are stacked in the same size and manner as the first FEOL and the second BEOL region,
wherein the second standard cell having a pin placement that is different from a pin placement of the first standard cell.

20. The integrated circuit of claim 19, wherein the second FEOL region is symmetrical with the first FEOL region with respect to an axis parallel with the first horizontal direction.

* * * * *